(12) United States Patent
Pugh et al.

(10) Patent No.: US 9,698,129 B2
(45) Date of Patent: Jul. 4, 2017

(54) STACKED INTEGRATED COMPONENT DEVICES WITH ENERGIZATION

(75) Inventors: Randall B. Pugh, Jacksonville, FL (US); Frederick A. Flitsch, New Windsor, NY (US); Daniel B. Otts, Fruit Cove, FL (US); James Daniel Riall, St. Johns, FL (US); Adam Toner, Jacksonville, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 0 days.

(21) Appl. No.: 13/358,656

(22) Filed: Jan. 26, 2012

(65) Prior Publication Data

US 2012/0236524 A1 Sep. 20, 2012

Related U.S. Application Data

(60) Provisional application No. 61/454,205, filed on Mar. 18, 2011, provisional application No. 61/454,591, filed on Mar. 21, 2011.

(51) Int. Cl.
| | |
|---|---|
| *H01L 25/16* | (2006.01) |
| *B29D 11/00* | (2006.01) |
| *G02B 1/04* | (2006.01) |
| *G02C 7/04* | (2006.01) |
| *G02C 7/08* | (2006.01) |

(52) U.S. Cl.
CPC ........ *H01L 25/16* (2013.01); *B29D 11/00826* (2013.01); *G02B 1/043* (2013.01); *G02C 7/04* (2013.01); *G02C 7/083* (2013.01); *H01L 2224/45139* (2013.01); *H01L 2224/45147* (2013.01); *H01L 2224/48091* (2013.01); *H01L 2224/48145* (2013.01); *H01L 2924/01015* (2013.01); *H01L 2924/01047* (2013.01); *H01L 2924/10253* (2013.01); *H01L 2924/1461* (2013.01); *H01L 2924/3025* (2013.01)

(58) Field of Classification Search
CPC .......... G02C 7/083; G02C 7/04; H01L 25/16; B29D 11/00826; G02B 1/043
USPC ........................................................ 361/790
See application file for complete search history.

(56) References Cited

U.S. PATENT DOCUMENTS

| 754,804 A | 3/1904 | Pratt |
|---|---|---|
| 3,291,296 A | 12/1966 | Lemkelde |

(Continued)

FOREIGN PATENT DOCUMENTS

| CN | 102159381 A | 8/2011 |
|---|---|---|
| CN | 102196789 A | 9/2011 |

(Continued)

OTHER PUBLICATIONS

PCT International Search Report dated Apr. 15, 2013 for PCT Intl. Appln. No. PCT/US2012/023190.

(Continued)

*Primary Examiner* — David M Sinclair
*Assistant Examiner* — Robert Brown

(57) ABSTRACT

This invention discloses a device comprising multiple functional layers formed on substrates, wherein at least one functional layer comprises an electrical energy source. In some embodiments, the present invention includes a component for incorporation into ophthalmic lenses that has been formed by the stacking of multiple functionalized layers.

18 Claims, 13 Drawing Sheets

(56) References Cited

U.S. PATENT DOCUMENTS

| | | | |
|---|---|---|---|
| 3,375,136 A * | 3/1968 | Biggar | 429/127 |
| 4,268,132 A | 5/1981 | Neefe | |
| 4,592,944 A | 6/1986 | Clark et al. | |
| 4,601,545 A | 7/1986 | Kern | |
| 4,787,903 A | 11/1988 | Grendahl | |
| 4,816,031 A | 3/1989 | Pfoff | |
| 4,921,728 A * | 5/1990 | Takiguchi et al. | 427/58 |
| 5,112,703 A | 5/1992 | Koenig | |
| 5,219,497 A | 6/1993 | Blum | |
| 5,227,805 A * | 7/1993 | King et al. | 343/702 |
| 5,478,420 A | 12/1995 | Gauci et al. | |
| 5,596,567 A | 1/1997 | deMuro et al. | |
| 5,600,180 A | 2/1997 | Kusaka et al. | |
| 5,682,210 A | 10/1997 | Weirich | |
| 5,712,721 A * | 1/1998 | Large | 359/245 |
| 6,217,171 B1 | 4/2001 | Auten et al. | |
| 6,322,589 B1 | 11/2001 | Cumming | |
| 6,355,501 B1 | 3/2002 | Fung et al. | |
| 6,364,482 B1 | 4/2002 | Roffman et al. | |
| 6,477,410 B1 | 11/2002 | Henley et al. | |
| 6,599,778 B2 | 7/2003 | Pogge et al. | |
| 6,638,304 B2 | 10/2003 | Azar | |
| 6,852,254 B2 | 2/2005 | Spaulding et al. | |
| 6,924,036 B2 | 8/2005 | Polastri et al. | |
| 7,324,287 B1 | 1/2008 | Gollier | |
| 7,404,636 B2 | 7/2008 | Blum et al. | |
| 7,410,700 B2 | 8/2008 | Wang | |
| 7,423,801 B2 | 9/2008 | Kaufman et al. | |
| 7,548,040 B2 | 6/2009 | Lee et al. | |
| 7,581,124 B1 | 8/2009 | Jacobson et al. | |
| 7,755,583 B2 * | 7/2010 | Meredith | 345/87 |
| 7,794,643 B2 | 9/2010 | Watanabe et al. | |
| 7,798,301 B2 | 9/2010 | Keating et al. | |
| 7,876,573 B2 * | 1/2011 | Motohara et al. | 361/790 |
| 7,968,991 B2 * | 6/2011 | Wong et al. | 257/686 |
| 7,991,934 B2 * | 8/2011 | Yao et al. | 710/301 |
| 8,014,164 B2 * | 9/2011 | Yang | 361/760 |
| 8,014,166 B2 * | 9/2011 | Yazdani | 361/790 |
| 8,309,397 B2 * | 11/2012 | Shim et al. | 438/109 |
| 8,343,216 B2 | 1/2013 | Brady et al. | |
| 8,579,435 B2 | 11/2013 | Blum et al. | |
| 8,857,983 B2 | 10/2014 | Pugh et al. | |
| 8,950,862 B2 | 2/2015 | Pugh et al. | |
| 9,102,111 B2 | 8/2015 | Pugh et al. | |
| 9,110,310 B2 | 8/2015 | Pugh et al. | |
| 9,134,546 B2 | 9/2015 | Pugh et al. | |
| 9,195,075 B2 | 11/2015 | Pugh et al. | |
| 9,233,513 B2 | 1/2016 | Pugh et al. | |
| 9,296,158 B2 | 3/2016 | Pugh et al. | |
| 2002/0041027 A1 | 4/2002 | Sugizaki | |
| 2002/0058151 A1 * | 5/2002 | Uchikoba et al. | 428/621 |
| 2002/0162631 A1 | 11/2002 | Wien et al. | |
| 2003/0002160 A1 | 1/2003 | Johnson et al. | |
| 2003/0021601 A1 | 1/2003 | Goldstein | |
| 2003/0069666 A1 | 4/2003 | Nagler | |
| 2003/0137922 A1 * | 7/2003 | Ro et al. | 369/283 |
| 2004/0000732 A1 | 1/2004 | Spaulding et al. | |
| 2004/0027536 A1 | 2/2004 | Blum et al. | |
| 2004/0084790 A1 | 5/2004 | Blum et al. | |
| 2004/0131925 A1 | 7/2004 | Jenson et al. | |
| 2004/0239874 A1 * | 12/2004 | Swab et al. | 351/123 |
| 2005/0036109 A1 | 2/2005 | Blum et al. | |
| 2005/0099594 A1 | 5/2005 | Blum et al. | |
| 2005/0185135 A1 | 8/2005 | Blum et al. | |
| 2005/0231677 A1 * | 10/2005 | Meredith | 349/143 |
| 2005/0255079 A1 | 11/2005 | Santerre et al. | |
| 2006/0001137 A1 | 1/2006 | Hundt et al. | |
| 2006/0026201 A1 | 2/2006 | Cabillic | |
| 2006/0095128 A1 | 5/2006 | Blum et al. | |
| 2006/0152912 A1 * | 7/2006 | Karrer et al. | 361/790 |
| 2006/0181676 A1 | 8/2006 | Tucker et al. | |
| 2006/0202359 A1 | 9/2006 | Chen | |
| 2006/0226556 A1 * | 10/2006 | Kurita et al. | 257/778 |
| 2006/0255441 A1 | 11/2006 | Ohta | |
| 2006/0265058 A1 | 11/2006 | Silvestrini | |
| 2006/0267167 A1 | 11/2006 | McCain | |
| 2007/0052876 A1 | 3/2007 | Kaufman et al. | |
| 2007/0090869 A1 * | 4/2007 | Adewole et al. | 327/425 |
| 2007/0128420 A1 | 6/2007 | Maghribi | |
| 2007/0159562 A1 | 7/2007 | Haddock et al. | |
| 2007/0231575 A1 | 10/2007 | Watanabe et al. | |
| 2007/0242171 A1 | 10/2007 | Mori | |
| 2007/0242173 A1 | 10/2007 | Blum et al. | |
| 2007/0285385 A1 | 12/2007 | Albert et al. | |
| 2008/0002149 A1 | 1/2008 | Fritsch et al. | |
| 2008/0020127 A1 | 1/2008 | Whiteford et al. | |
| 2008/0024858 A1 | 1/2008 | Kaufman et al. | |
| 2008/0042227 A1 | 2/2008 | Asano et al. | |
| 2008/0048180 A1 | 2/2008 | Abe et al. | |
| 2008/0058652 A1 | 3/2008 | Payne | |
| 2008/0079396 A1 | 4/2008 | Yamazaki et al. | |
| 2008/0086206 A1 | 4/2008 | Nasiatka et al. | |
| 2008/0208335 A1 | 8/2008 | Blum et al. | |
| 2008/0212007 A1 * | 9/2008 | Meredith | 349/139 |
| 2008/0261390 A1 * | 10/2008 | Chen et al. | 438/613 |
| 2009/0002012 A1 | 1/2009 | Doong et al. | |
| 2009/0003383 A1 | 1/2009 | Watanabe et al. | |
| 2009/0033863 A1 * | 2/2009 | Blum et al. | 351/160 R |
| 2009/0046349 A1 | 2/2009 | Haddock et al. | |
| 2009/0050267 A1 | 2/2009 | Conlon et al. | |
| 2009/0079641 A1 | 3/2009 | Cruzado et al. | |
| 2009/0091818 A1 | 4/2009 | Haddock et al. | |
| 2009/0105817 A1 | 4/2009 | Bretthauer et al. | |
| 2009/0175016 A1 * | 7/2009 | Legen et al. | 361/787 |
| 2009/0182426 A1 | 7/2009 | Von Arx et al. | |
| 2009/0204207 A1 | 8/2009 | Blum et al. | |
| 2009/0204454 A1 | 8/2009 | Lagudi | |
| 2009/0243125 A1 * | 10/2009 | Pugh et al. | 264/1.36 |
| 2009/0244477 A1 * | 10/2009 | Pugh et al. | 351/158 |
| 2009/0256977 A1 | 10/2009 | Haddock et al. | |
| 2009/0269392 A1 | 10/2009 | Tauber et al. | |
| 2009/0278503 A1 | 11/2009 | Hundt et al. | |
| 2010/0001926 A1 | 1/2010 | Amirparviz et al. | |
| 2010/0002190 A1 | 1/2010 | Clarke et al. | |
| 2010/0072643 A1 * | 3/2010 | Pugh et al. | 264/2.7 |
| 2010/0073534 A1 | 3/2010 | Yano et al. | |
| 2010/0076553 A1 * | 3/2010 | Pugh et al. | 623/6.22 |
| 2010/0078838 A1 | 4/2010 | Pugh et al. | |
| 2010/0079724 A1 * | 4/2010 | Pugh et al. | 351/177 |
| 2010/0103368 A1 | 4/2010 | Amirparviz et al. | |
| 2010/0103369 A1 | 4/2010 | Pugh et al. | |
| 2010/0109175 A1 | 5/2010 | Pugh et al. | |
| 2010/0110372 A1 * | 5/2010 | Pugh et al. | 351/177 |
| 2010/0149777 A1 * | 6/2010 | Yamamoto et al. | 361/790 |
| 2010/0211186 A1 * | 8/2010 | Senders et al. | 623/24 |
| 2010/0295135 A1 | 11/2010 | Masuoka et al. | |
| 2011/0007656 A1 | 1/2011 | He et al. | |
| 2011/0045112 A1 | 2/2011 | Pugh et al. | |
| 2011/0074281 A1 * | 3/2011 | Farquhar et al. | 313/504 |
| 2011/0076567 A1 | 3/2011 | Bouillon | |
| 2011/0076568 A1 | 3/2011 | Bouillon | |
| 2011/0134683 A1 | 6/2011 | Yamazaki et al. | |
| 2011/0174431 A1 * | 7/2011 | Darmes et al. | 156/212 |
| 2011/0230963 A1 | 9/2011 | Cuavas | |
| 2011/0284912 A1 | 11/2011 | Sekine et al. | |
| 2012/0024295 A1 | 2/2012 | Mihin | |
| 2012/0026598 A1 | 2/2012 | Pugh et al. | |
| 2012/0057244 A1 | 3/2012 | Pugh et al. | |
| 2012/0092612 A1 * | 4/2012 | Binder | 351/159.02 |
| 2012/0100412 A1 * | 4/2012 | Kwon et al. | 429/149 |
| 2012/0162600 A1 | 6/2012 | Pugh et al. | |
| 2012/0218508 A1 | 8/2012 | Pugh et al. | |
| 2012/0234453 A1 | 9/2012 | Pugh et al. | |
| 2012/0235277 A1 | 9/2012 | Pugh et al. | |
| 2012/0236254 A1 | 9/2012 | Pugh et al. | |
| 2012/0236524 A1 | 9/2012 | Pugh et al. | |
| 2012/0242953 A1 | 9/2012 | Pugh et al. | |
| 2012/0245444 A1 | 9/2012 | Otis et al. | |
| 2012/0259188 A1 | 10/2012 | Besling | |
| 2013/0019540 A1 | 1/2013 | Magnus | |
| 2013/0194540 A1 | 8/2013 | Pugh et al. | |
| 2013/0215380 A1 | 8/2013 | Pugh et al. | |
| 2013/0245754 A1 | 9/2013 | Blum et al. | |
| 2013/0245755 A1 | 9/2013 | Fehr et al. | |

(56) References Cited

U.S. PATENT DOCUMENTS

| | | |
|---|---|---|
| 2014/0036226 A1 | 2/2014 | Blum et al. |
| 2014/0148899 A1 | 5/2014 | Fehr et al. |
| 2014/0306361 A1 | 10/2014 | Pugh et al. |
| 2015/0212339 A1 | 7/2015 | Pugh et al. |
| 2015/0309337 A1 | 10/2015 | Flitsch et al. |
| 2015/0323811 A1 | 11/2015 | Flitsch et al. |
| 2015/0378176 A1 | 12/2015 | Flitsch et al. |

FOREIGN PATENT DOCUMENTS

| | | |
|---|---|---|
| CN | 102196789 B | 11/2014 |
| DE | 19858172 A1 | 6/2000 |
| DE | 102007048859 | 4/2009 |
| EP | 1262307 A2 | 12/2002 |
| EP | 1342560 A2 | 9/2003 |
| EP | 1262307 A3 | 11/2003 |
| EP | 1342560 A3 | 11/2004 |
| EP | 1736291 A3 | 12/2006 |
| EP | 1747879 A2 | 1/2007 |
| EP | 1736291 A3 | 3/2007 |
| EP | 1747879 A3 | 3/2007 |
| EP | 1760515 A2 | 3/2007 |
| EP | 1849574 A2 | 10/2007 |
| EP | 1849589 A2 | 10/2007 |
| EP | 1342560 B1 | 7/2008 |
| EP | 1849589 A3 | 3/2009 |
| EP | 1262307 B1 | 2/2010 |
| EP | 1760515 A3 | 8/2011 |
| JP | 1286809 A | 11/1989 |
| JP | 10-209185 | 8/1998 |
| JP | 200128036 | 1/2001 |
| JP | 2007-313594 | 12/2007 |
| JP | 2008-227068 | 9/2008 |
| JP | 201034254 | 2/2010 |
| TW | 200532278 A | 10/2005 |
| WO | WO 9423334 A1 | 10/1994 |
| WO | WO 03/090611 | 11/2003 |
| WO | WO 03090611 | 11/2003 |
| WO | WO 2004015460 | 2/2004 |
| WO | WO 2005088388 A1 | 9/2005 |
| WO | WO 2006050171 A2 | 5/2006 |
| WO | WO 2006077192 | 7/2006 |
| WO | WO 2006050171 A3 | 9/2006 |
| WO | WO 2006115649 | 11/2006 |
| WO | WO 2007/050402 A1 | 5/2007 |
| WO | WO 2006115649 | 6/2007 |
| WO | WO 2007081959 A2 | 7/2007 |
| WO | WO 2007081959 A3 | 5/2008 |
| WO | WO 2008091859 A1 | 7/2008 |
| WO | WO 2008103906 | 8/2008 |
| WO | WO 2008103906 A2 | 8/2008 |
| WO | WO 2008109867 A2 | 9/2008 |
| WO | WO 2008109867 A3 | 10/2008 |
| WO | WO 200810390 A3 | 11/2008 |
| WO | WO 2008103906 | 11/2008 |
| WO | WO 2009/038897 | 3/2009 |
| WO | WO 2009/105261 | 8/2009 |
| WO | WO 2009105261 | 8/2009 |
| WO | WO 2009105261 A1 | 8/2009 |
| WO | WO 2009/113296 | 9/2009 |
| WO | WO 2009/117506 | 9/2009 |
| WO | WO 2010/033683 | 3/2010 |
| WO | WO 2010033679 A2 | 3/2010 |
| WO | WO 2010033683 | 3/2010 |
| WO | WO 2010033683 A1 | 3/2010 |
| WO | WO 2010/039610 | 4/2010 |
| WO | WO 2010/051225 A1 | 5/2010 |
| WO | WO 2010051203 A1 | 5/2010 |
| WO | WO 2010/082993 | 7/2010 |
| WO | WO 2010133317 | 11/2010 |
| WO | WO 2011083105 | 7/2011 |
| WO | WO 2011083105 A1 | 7/2011 |
| WO | WO 2011/163080 A1 | 12/2011 |
| WO | WO 2011163080 | 12/2011 |
| WO | WO 2012018583 A1 | 2/2012 |
| WO | WO 2013112748 A1 | 8/2013 |

OTHER PUBLICATIONS

PCT International Search Report, dated Jul. 2, 2012 for PCT Int'l Appln. No. PCT/US2012/026849.

PCT International Search Report, dated Oct. 2, 2012 for PCT Int'l Appln. No. PCT/US2012/029769.

European Search Report for Application No. EP 13 15 6410 Date of Completion of Report Jun. 5, 2013.

Pandey, J.; Yu-Te Liao; Lingley, A.; Mirjalili, R.; Parviz, B.; Otis, B.P., "A Fully Integrated RF-Powered Contact Lens With a Single Element Display," Biomedical Circuits and Systems, IEEE Transactions on, vol. 4, No. 6, pp. 454, 461, Dec. 2010.

Loy, M., et al., "ISM-Band and Short Range Device Antennas", Texas Instruments Application Report, Aug. 2005. Online: http://www.ti.com/lit/answra046a/.

Pandey, J., et al. "Toward an Active Contact Lens: Integration of a Wireless Power Harvesting IC", Dept. of Elect. Eng., University of Washington, Seattle, WA, USA. Biomedical Circuits and Systems Conference, 2009. BioCAS 2009. IEEE Issue Date: Nov. 26-28, 2009 pp. 125-128 online: http:/wireless.ee.washington.edu/papers/biocas2009inpyudodpo.pdf.

Parviz, B., "Augmented Reality in a Contact Lens", IEEE Spectrum, Sep. 2009. Online: http:/spectrum.ieee.org/biomedical/bionics/augmented-reality-in-a-contact- -lens/O.

Williams, A. "Swiss Startup Puts MEMS Sensor in Contact Lens", Electronics Weekly.com, Mar. 25, 2010, 9:29 AM online: http://www.electronicsweekly.com/blogs/uk-technology-startups/2010/03/swi- ss-startup-puts-mems-sensor.tml.

Davies, C., "Opto-Electronic Contact Lenses Promise Wireless Displays", Nov. 25, 2009. Online: http://www.slashgear.com/opto-electronic-contact-lenses-promise-wireless--displays-2564454/.

Orca, Surfdaddy, "Micro Machines and Opto-Electronics on a Contact Lens", Nov. 20, 2009. Online: http://www.hplusmagazine.com/arraicles/toys-tools/micro-machines-and-opto- -electortncis-contact-lense.

Parviz, Babak, A., "Augmented Reality in a Contact Lens, A New Generation of Contact Lenses Built With Very Small Circuits and LEDs Promises Bionic Eyesight", IEEE Spectrum.org/biomedical/bionics, downloaded Jul. 10, 2012.

Gosalia K.,: "Novel Compact Antennas for Biomedical Implants and Wireless Applications", PhD Dissertation, North Carolina State University, 2004, [retrieved from internet on Dec. 22, 2014]: URL> http://repository.lib.ncsu.edu/ir/bitstream/1840.16/4508/1/etd.pdf?origin=publication_detail.

Ratta, Varun "Crystallization, Morphology, Thermal Stability and Adhesive Properties of Novel High Performance Semicrystalline Polyimides" PhD Dissertation defended Apr. 26, 1999 Virginia Tech University, entire Chapter 4.

European Search Report for corresponding Application No. 13152733.5-1562 dated Apr. 30, 2013.

Singapore Search Report for corresponding Application No. SG-201300387-6 dated Apr. 7, 2013.

PCT International Search Report, dated Oct. 2, 2012 for PCT Int'l Appln. No. PCT/US2012/029796.

European Search Report for Application No. EP.

International Search Report for PCT PCT/US2012/026849 Date of Jul. 2, 2012.

PCT Written Opinion for PCT Int'l Appln. No. PCT/US2013/023182.

PCT International Search Report, dated Dec. 23, 2009, for PCT Int'l Appln. No. PCT/US2009/057289.

PCT International Search Report dated May 4, 2010, for PCT Int'l Appln. No. PCT/US2009/057284.

PCT International Preliminary Report for patentability—Written Opinion for : PCT!US2013.dagger.023005.

(56) References Cited

OTHER PUBLICATIONS

JP Office Action—Application No. Patent Application 2013-556789.

* cited by examiner

STACKED INTEGRATED COMPONENT DEVICES WITH ENERGIZATION

RELATED APPLICATIONS

This application claims priority to U.S. Provisional Application Ser. No. 61/454,205 filed on Mar. 18, 2011; and U.S. Provisional Application Ser. No. 61/454,591 filed on Mar. 21, 2011; the contents of which are relied upon and incorporated by reference.

FIELD OF USE

This invention describes a device formed from multiple functional layers which are stacked, wherein at least one layer includes a power source as well as, in some embodiments, methods and apparatus for the fabrication of a stacked integrated component device based on multiple stacked layers.

BACKGROUND

Traditionally an ophthalmic device, such as a contact lens, an intraocular lens or a punctal plug included a biocompatible device with a corrective, cosmetic or therapeutic quality. A contact lens, for example, may provide one or more of: vision correcting functionality; cosmetic enhancement; therapeutic effects. Each function is provided by a physical characteristic of the lens. A design incorporating a refractive quality into a lens may provide a vision corrective function. A pigment incorporated into the lens may provide a cosmetic enhancement. An active agent incorporated into a lens may provide a therapeutic functionality. Such physical characteristics are accomplished without the lens entering into an energized state. A punctal plug has traditionally been a passive device.

More recently, it has been theorized that active components may be incorporated into a contact lens. Some components may include semiconductor devices. Some examples have shown semiconductor devices embedded in a contact lens placed upon animal eyes. It has also been described how the active components may be energized and activated in numerous manners within the lens structure itself. The topology and size of the space defined by the lens structure creates a novel and challenging environment for the definition of various functionality. Generally, such disclosures have included discrete devices. However, the size and power requirements for available discrete devices are not necessarily conducive for inclusion in a device to be worn on a human eye. Technological embodiments that address such an ophthalmological background need generate solutions that not only address ophthalmic requirements but also encompass novel embodiments for the more general technology space of powered electrical devices.

SUMMARY OF THE INVENTION

Accordingly, the present invention includes designs of components that may be combined to form a stacked layer of substrates combined into a discrete package. The stacked layers will include one or more layers which can include a power source for at least one component included in the stacked layers. In some embodiments, an insert can be provided that may be energized and incorporated into an ophthalmic device. The insert may be formed of multiple layers which may have unique functionality for each layer; or alternatively mixed functionality but in multiple layers.

The layers may in some embodiments have layers dedicated to the energization of the product or the activation of the product or for control of functional components within the lens body.

In addition, methods and apparatus for forming an ophthalmic lens, with inserts of stacked functionalized layers are presented.

In some embodiments, the insert may contain a layer in an energized state which is capable of powering a component capable of drawing a current. Components may include, for example, one or more of: a variable optic lens element, and a semiconductor device, which may either be located in the stacked layer insert or otherwise connected to it.

In another aspect, some embodiments may include a cast molded silicone hydrogel contact lens with a rigid or formable insert of stacked functionalized layers contained within the ophthalmic lens in a biocompatible fashion, wherein at least one of the functionalized lens includes a power source.

Accordingly, the present invention includes a disclosure of a technological framework for devices formed from multiple stacked layers with energization. In exemplary embodiments, disclosure is made for an ophthalmic lens with a stacked functionalized layer portion, apparatus for forming an ophthalmic lens with a stacked functionalized layer portion and methods for the same. An insert may be formed from multiple layers in various manners as discussed herein and the insert may be placed in proximity to one, or both of, a first mold part and a second mold part. A reactive monomer mix is placed between the first mold part and the second mold part. The first mold part is positioned proximate to the second mold part thereby forming a lens cavity with the energized substrate insert and at least some of the reactive monomer mix in the lens cavity; the reactive monomer mix is exposed to actinic radiation to form an ophthalmic lens. Lenses may be formed via the control of actinic radiation to which the reactive monomer mixture is exposed.

DETAILED DESCRIPTION OF THE INVENTION

Figure 1:
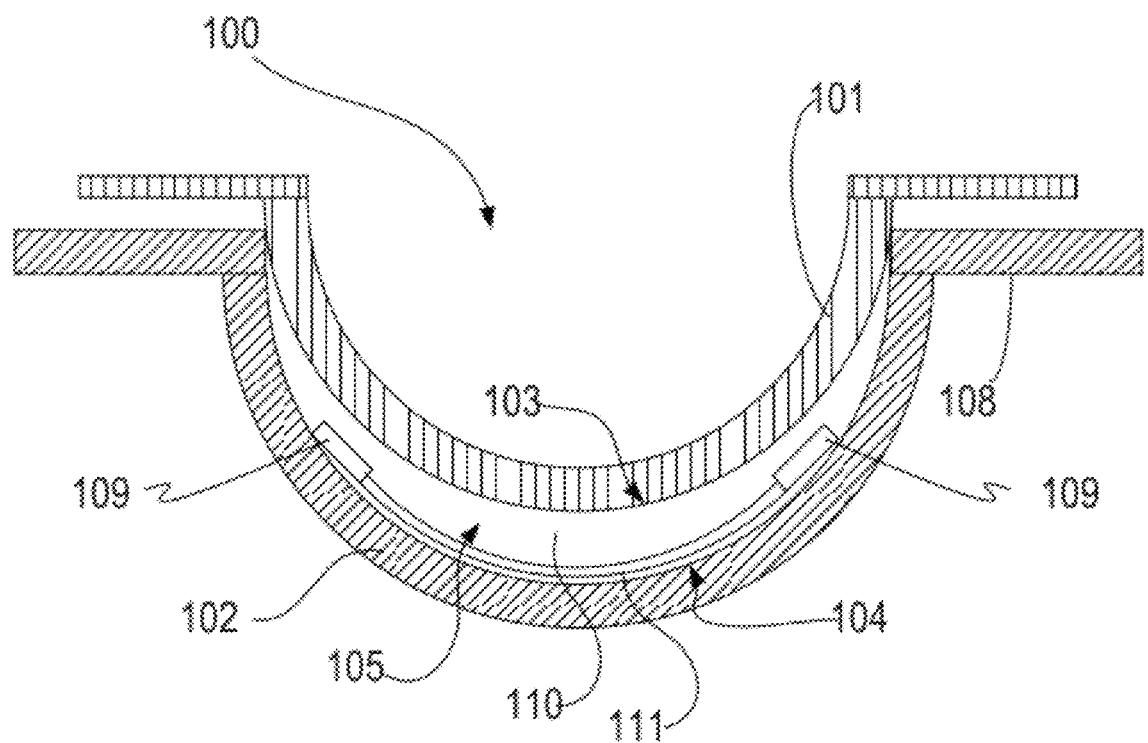
FIG. 1 illustrates a mold assembly apparatus according to previously described embodiments.

The present invention includes a substrate insert device formed through the stacking of multiple functionalized layers. Additionally the present invention includes methods and apparatus for manufacturing an ophthalmic lens with such a stacked functionalized layer substrate as an insert in the formed lens. In addition, some embodiments of the present invention include an ophthalmic lens with a stacked functionalized layer substrate insert incorporated into the ophthalmic lens.

In the following sections detailed descriptions of embodiments of the invention will be given. The description of both preferred and alternative embodiments are exemplary embodiments only, and it is understood that to those skilled in the art that variations, modifications and alterations may be apparent. It is therefore to be understood that said exemplary embodiments do not limit the scope of the underlying invention.

Glossary

In this description and claims directed to the presented invention, various terms may be used for which the following definitions will apply:

Energized: as used herein refers to the state of being able to supply electrical current to or to have electrical energy stored within.

Energy: as used herein refers to the capacity of a physical system to do work. Many uses within this invention may relate to the said capacity being able to perform electrical actions in doing work.

Energy Source: as used herein refers to device or layer which is capable of supplying Energy or placing a logical or electrical device in an Energized state.

Energy Harvesters: as used herein refers to device capable of extracting energy from the environment and convert it to electrical energy.

Functionalized: as used herein refers to making a layer or device able to perform a function including for example, energization, activation, or control.

Lens: refers to any ophthalmic device that resides in or on the eye. These devices may provide optical correction or may be cosmetic. For example, the term lens may refer to a contact lens, intraocular lens, overlay lens, ocular insert, optical insert or other similar device through which vision is corrected or modified, or through which eye physiology is cosmetically enhanced (e.g. iris color) without impeding vision. In some embodiments, the preferred lenses of the invention are soft contact lenses are made from silicone elastomers or hydrogels, which include but are not limited to silicone hydrogels, and fluorohydrogels.

Lens forming mixture or "Reactive Mixture" or "RMM" (reactive monomer mixture): as used herein refers to a monomer or prepolymer material which may be cured and crosslinked or crosslinked to form an ophthalmic lens. Various embodiments may include lens forming mixtures with one or more additives such as: UV blockers, tints, photoinitiators or catalysts, and other additives one might desire in an ophthalmic lenses such as, contact or intraocular lenses.

Lens Forming Surface: refers to a surface that is used to mold a lens. In some embodiments, any such surface 103-104 can have an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

Lithium Ion Cell: refers to an electrochemical cell where Lithium ions move through the cell to generate electrical energy. This electrochemical cell, typically called a battery, may be reenergized or recharged in its typical forms.

Substrate insert: as used herein refers to a formable or rigid substrate capable of supporting an Energy Source within an ophthalmic lens. In some embodiments, the Substrate insert also supports one or more components.

Mold: refers to a rigid or semi-rigid object that may be used to form lenses from uncured formulations. Some preferred molds include two mold parts forming a front curve mold part and a back curve mold part.

Optical Zone: as used herein refers to an area of an ophthalmic lens through which a wearer of the ophthalmic lens sees.

Power: as used herein refers to work done or energy transferred per unit of time.

Rechargeable or Re-energizable: as used herein refers to a capability of being restored to a state with higher capacity to do work. Many uses within this invention may relate to the capability of being restored with the ability to flow electrical current at a certain rate for a certain, reestablished time period.

Reenergize or Recharge: To restore to a state with higher capacity to do work.

Many uses within this invention may relate to restoring a device to the capability to flow electrical current at a certain rate for a certain, reestablished time period.

Released from a mold: means that a lens is either completely separated from the mold, or is only loosely attached so that it may be removed with mild agitation or pushed off with a swab.

Stacked: as used herein means to place at least two component layers in proximity to each other such that at least a portion of one surface of one of the layers contacts a first surface of a second layer. In some embodiments, a film, whether for adhesion or other functions may reside between the two layers that are in contact with each other through said film.

"Stacked Integrated Component Devices" as used herein and sometimes referred to as "SIC-Devices", refers to the product of packaging technologies that can assemble thin layers of substrates, which may contain electrical and electromechanical devices, into operative integrated devices by means of stacking at least a portion of each layer upon each other. The layers may comprise component devices of various types, materials, shapes, and sizes. Furthermore, the layers may be made of various device production technologies to fit and assume various contours as it may be desired.

Description

An energized lens 100 with an embedded Substrate insert 111 may include an Energy Source 109, such as an electrochemical cell or battery as the storage means for the energy and in some embodiments, encapsulation and isolation of the materials comprising the Energy Source from an environment into which an ophthalmic lens is placed.

In some embodiments, a Substrate insert also includes a pattern of circuitry, components, and Energy Sources 109. Various embodiments can include the Substrate insert locating the pattern of circuitry, components and Energy Sources 109 around a periphery of an optic zone through which a wearer of a lens would see, while other embodiments can include a pattern of circuitry, components and Energy Sources 109 which are small enough to not adversely affect the sight of a contact lens wearer and therefore the Substrate insert can locate them within, or exterior to, an optical zone. In general, according to embodiments previously described, a Substrate Insert 111 is embodied within an ophthalmic lens via automation which places an Energy Source a desired location relative to a mold part used to fashion the lens.

Molds

Referring now to FIG. 1, a diagram of an exemplary mold 100 for an ophthalmic lens is illustrated with a Substrate insert 111. As used herein, the terms a mold includes a form 100 having a cavity 105 into which a lens forming mixture 110 can be dispensed such that upon reaction or cure of the lens forming mixture, an ophthalmic lens of a desired shape is produced. The molds and mold assemblies 100 of this invention are made up of more than one "mold parts" or "mold pieces" 101-102. The mold parts 101-102 can be brought together such that a cavity 105 is formed between the mold parts 101-102 in which a lens can be formed. This combination of mold parts 101-102 is preferably temporary. Upon formation of the lens, the mold parts 101-102 can again be separated for removal of the lens.

At least one mold part 101-102 has at least a portion of its surface 103-104 in contact with the lens forming mixture such that upon reaction or cure of the lens forming mixture 110 that surface 103-104 provides a desired shape and form to the portion of the lens with which it is in contact. The same is true of at least one other mold part 101-102.

Thus, for example, in a preferred embodiment a mold assembly 100 is formed from two parts 101-102, a female concave piece (front piece) 102 and a male convex piece (back piece) 101 with a cavity formed between them. The portion of the concave surface 104 which makes contact with lens forming mixture has the curvature of the front curve of an ophthalmic lens to be produced in the mold assembly 100 and is sufficiently smooth and formed such that the surface of an ophthalmic lens formed by polymerization of the lens forming mixture which is in contact with the concave surface 104 is optically acceptable.

In some embodiments, the front mold piece 102 can also have an annular flange integral with and surrounding circular circumferential edge 108 and extends from it in a plane normal to the axis and extending from the flange (not shown).

A lens-forming surface can include a surface 103-104 with an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

At 111, a Substrate insert is illustrated onto which an Energy Source 109 may be placed. The Substrate insert 111 may be any receiving material onto which an Energy Source 109 may be placed, in some embodiments may also include circuit paths, components, and other aspects useful to use of the energy source. In some embodiments, the Substrate insert 111 can be a clear coat of a material which be incorporated into a lens when the lens is formed. The clear coat can include for example a pigment as described below, a monomer or other biocompatible material. Additional embodiments can include a media comprising an insert, which can be either rigid or formable. In some embodiments, a rigid insert may include an optical zone providing an optical property (such as those utilized for vision correction) and a non-optical zone portion. An Energy Source can be placed on one or both of the optic zone and non-optic zone of the insert. Still other embodiments can include an annular insert, either rigid or formable or some shape which circumvents an optic zone through which a user sees.

Various embodiments also include placing an Energy Source 109 onto Substrate insert 111 prior to placement of the Substrate insert 111 into a mold portion used to form a lens. The Substrate insert 111 may also include one or more components which will receive an electrical charge via the Energy Source 109.

In some embodiments, a lens with a Substrate insert 111 can include a rigid center soft skirt design in which a central rigid optical element is in direct contact with the atmosphere and the corneal surface on respective an anterior and posterior surfaces, wherein the soft skirt of lens material (typically a hydrogel material) is attached to a periphery of the rigid optical element and the rigid optical element also acts as a Substrate insert providing energy and functionality to the resulting ophthalmic lens.

Some additional embodiments include a Substrate insert 111 that is a rigid lens insert fully encapsulated within a hydrogel matrix. A Substrate insert 111 which is a rigid lens insert may be manufactured, for example using microinjection molding technology. Embodiments can include, for example, a poly (4-methylpent-1-ene) copolymer resin with a diameter of between about 6 mm to 10 mm and a front surface radius of between about 6 mm and 10 mm and a rear surface radius of between about 6 mm and 10 mm and a center thickness of between about 0.050 mm and 0.5 mm. Some exemplary embodiments include an insert with diameter of about 8.9 mm and a front surface radius of about 7.9 mm and a rear surface radius of about 7.8 mm and a center thickness of about 0.100 mm and an edge profile of about 0.050 radius. One exemplary micro-molding machine can include the Microsystem 50 five-ton system offered by Battenfield Inc.

The Substrate insert can be placed in a mold part 101-102 utilized to form an ophthalmic lens.

Mold part 101-102 material can include, for example: a polyolefin of one or more of: polypropylene, polystyrene, polyethylene, poly (methyl methacrylate), and modified polyolefin. Other molds can include a ceramic or metallic material.

A preferred alicyclic co-polymer contains two different alicyclic polymers and is sold by Zeon Chemicals L.P. under the trade name ZEONOR. There are several different grades of ZEONOR. Various grades may have glass transition temperatures ranging from 105° C. to 160° C. A specifically preferred material is ZEONOR 1060R.

Other mold materials that may be combined with one or more additives to form an ophthalmic lens mold include, for example, Zieglar-Natta polypropylene resins (sometimes referred to as znPP). An exemplary Zieglar-Natta polypropylene resin is available under the name PP 9544 MED. PP 9544 MED is a clarified random copolymer for clean molding as per FDA regulation 21 CFR (c) 3.2 made available by Exxonmobil Chemical Company. PP 9544 MED is a random copolymer (znPP) with ethylene group (hereinafter 9544 MED). Other exemplary Zieglar-Natta polypropylene resins include: Atofina Polypropylene 3761 and Atofina Polypropylene 3620WZ.

Still further, in some embodiments, the molds of the invention may contain polymers such as polypropylene, polyethylene, polystyrene, poly (methyl methacrylate), modified polyolefin containing an alicyclic moiety in the main chain and cyclic polyolefin. This blend can be used on either or both mold halves, where it is preferred that this blend is used on the back curve and the front curve consists of the alicyclic co-polymers.

In some preferred methods of making molds 100 according to the present invention, injection molding is utilized according to known techniques, however, embodiments can also include molds fashioned by other techniques including, for example: lathing, diamond turning, or laser cutting.

Stacked Functionalized Layer Inserts

Figure 2:
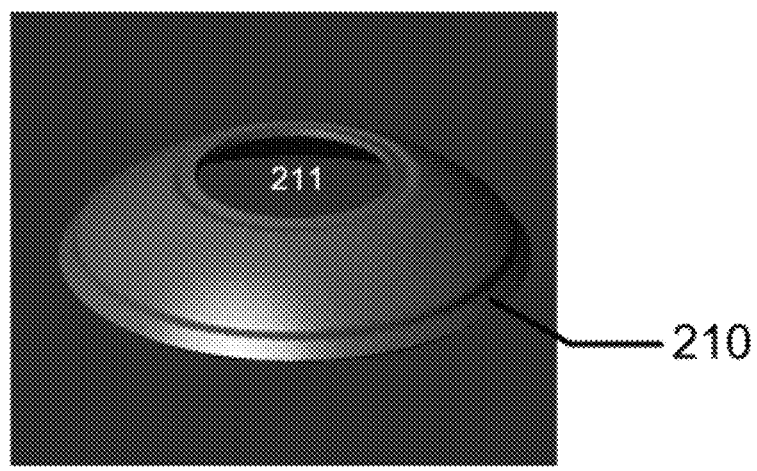
FIG. 2 illustrates an exemplary embodiment of an exemplary form factor for an insert which can be placed within an ophthalmic lens.

Referring now to FIG. 2, an exemplary design of one embodiment of a Substrate insert 111 which has been formed as a Stacked Functionalized Layer Insert is illustrated. This invention relates to novel methods to prepare and form the substrate insert that may be utilized and formed into Ophthalmic Lenses in manners consistent with the previously described art. For clarity of description, but not limiting the scope of the claimed invention, an exemplary Substrate insert 210 is illustrated and described, which comprises a full annular ring with an optical lens area 211. It may be obvious to one skilled in the arts that the inventive art described in this specification has similar application to the various diversity of shapes and embodiments that have been described generically for Substrate inserts of various kinds.

Figure 3:
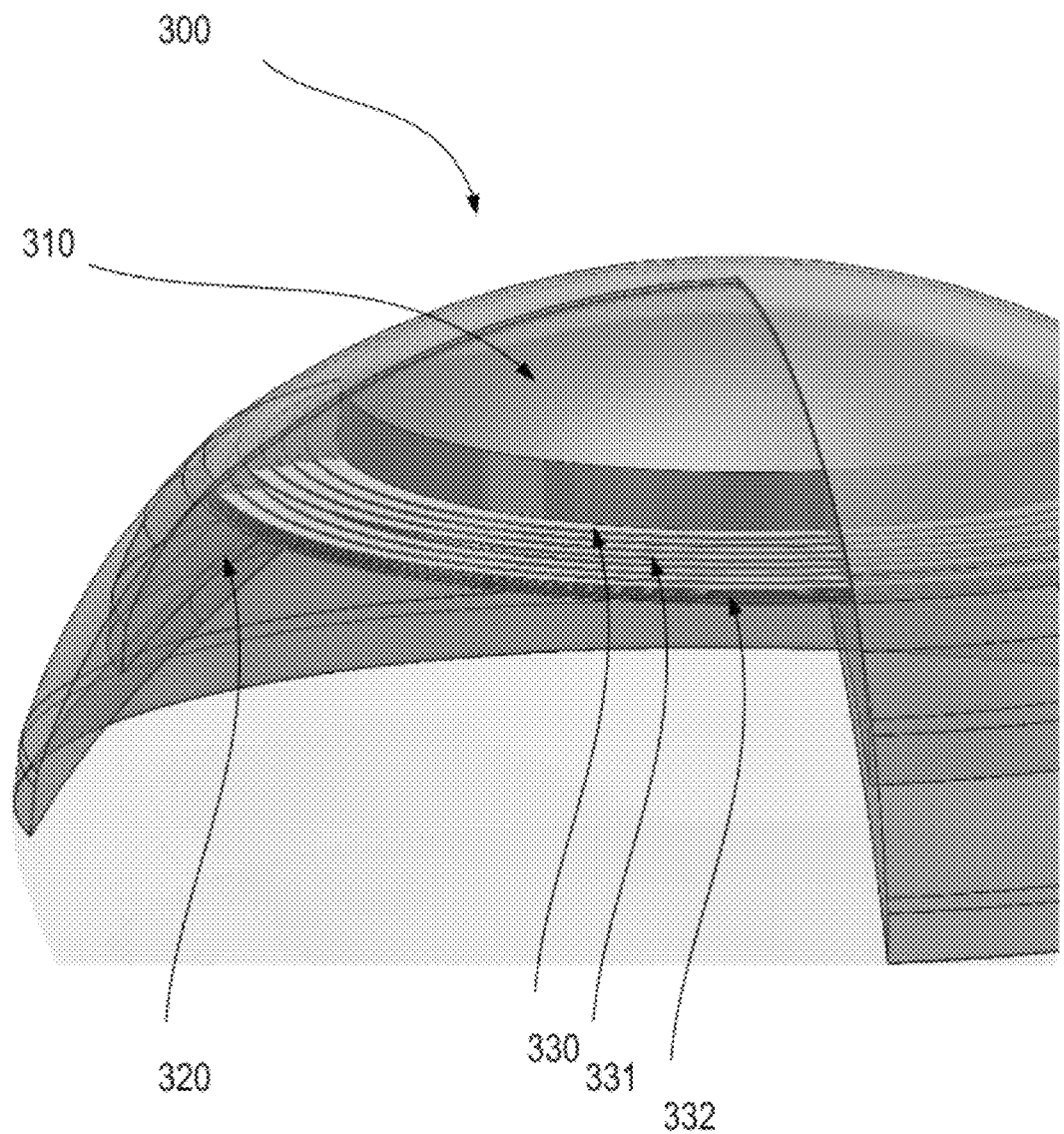
FIG. 3 illustrates a three dimensional representation of an insert formed of stacked functional layers which is incorporated within an ophthalmic lens mold part.

Referring now to FIG. 3 a three dimensional representation is illustrated of some embodiments of a fully formed ophthalmic lens using a stacked layer substrate insert of the type in item 210 is demonstrated as item 300. The representation shows a partial cut out from the ophthalmic lens to realize the different layers present inside the device. Item 320 shows the body material in cross section of the encapsulating layers of the substrate insert. This item surrounds the entire periphery of the ophthalmic lens. It may be clear to one skilled in the arts that the actual insert may comprise a full annular ring or other shapes that still may reside within the constraints of the size of a typical ophthalmic lens.

Items 330, 331 and 332 are meant to illustrate three of numerous layers that may be found in a substrate insert formed as a stack of functional layers. In some embodiments, a single layer may include one or more of: active and passive components and portions with structural, electrical or physical properties conducive to a particular purpose.

In some embodiments, a layer 330 may include an energization source, such as, for example, one or more of: a battery, a capacitor and a receiver within the layer 330. Item 331 then, in a non limiting exemplary sense may comprise microcircuitry in a layer that detects actuation signals for the ophthalmic lens. In some embodiments, a power regulation layer 332, may be included that is capable of receiving power from external sources, charges the battery layer 330 and controls the use of battery power from layer 330 when the lens is not in a charging environment. The power regulation may also control signals to an exemplary active lens, demonstrated as item 310 in the center annular cutout of the substrate insert.

An energized lens with an embedded Substrate insert may include an Energy Source, such as an electrochemical cell or battery as the storage means for the energy and in some embodiments, encapsulation, and isolation of the materials comprising the Energy Source from an environment into which an ophthalmic lens is placed.

In some embodiments, a Substrate insert also includes a pattern of circuitry, components, and Energy Sources. Various embodiments may include the Substrate insert locating the pattern of circuitry, components and Energy Sources around a periphery of an optic zone through which a wearer of a lens would see, while other embodiments may include a pattern of circuitry, components and Energy Sources which are small enough to not adversely affect the sight of a contact lens wearer and therefore the Substrate insert may locate them within, or exterior to, an optical zone.

In general, according to these embodiments previously described, a Substrate insert 111 is embodied within an ophthalmic lens via automation which places an Energy Source a desired location relative to a mold part used to fashion the lens.

Figure 4:
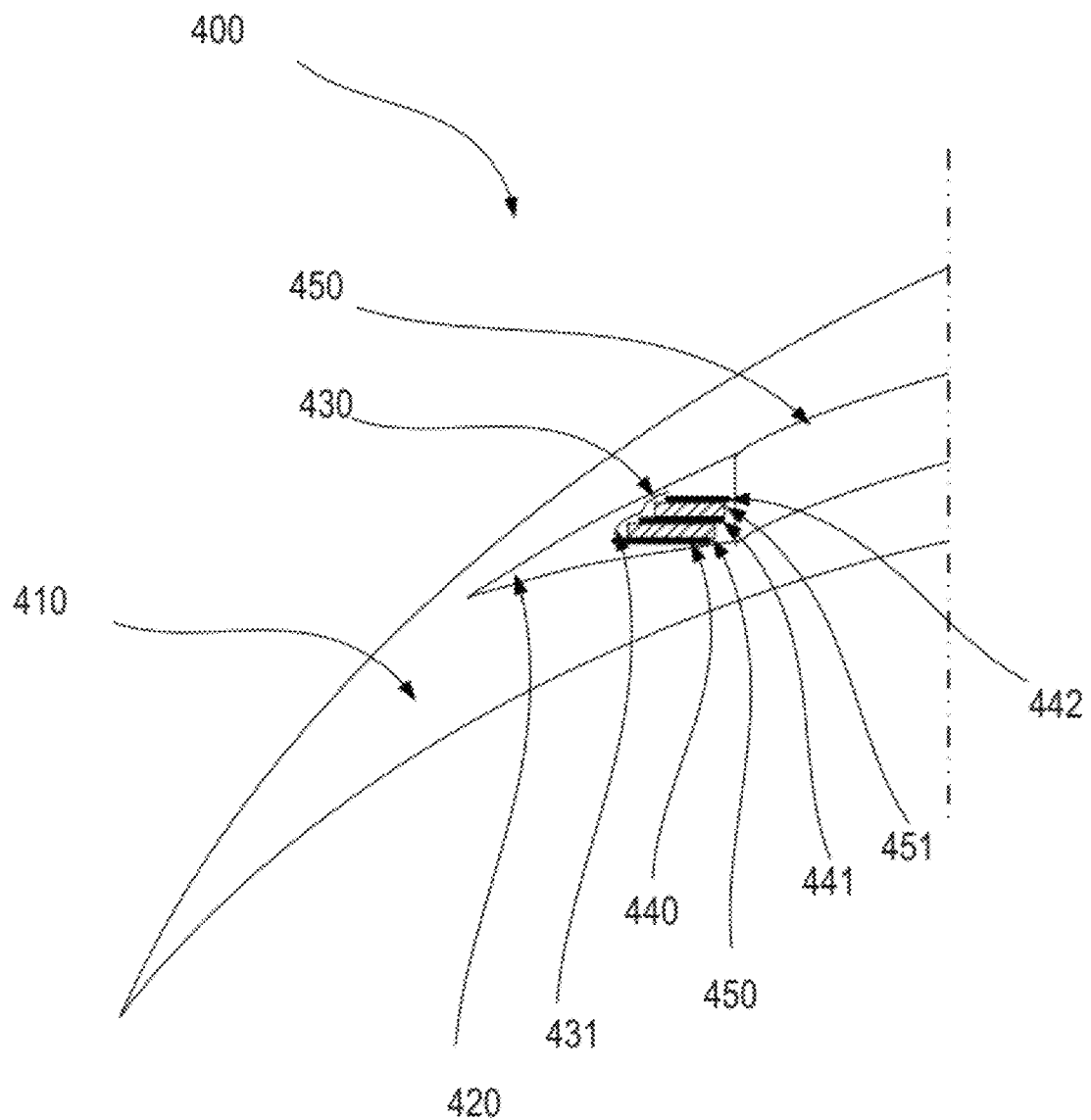
FIG. 4 illustrates a cross sectional representation of an ophthalmic lens mold part with an insert.

FIG. 4 illustrates a closer view of some embodiments of a stacked functional layer insert 400 seen in cross section. Within the body of the ophthalmic lens 410 is embedded the functionalized layer insert 420 which surrounds and connects to an active lens component 450, in some embodiments. It may be clear to one skilled in the arts, that this example shows but one of numerous embodiments of embedded function that may be placed within an ophthalmic lens.

Within the stacked layer portion of the insert are demonstrated numerous layers. In some embodiments the layers may comprise multiple semiconductor based layers. For example, item 440, the bottom layer in the stack, may be a thinned silicon layer upon which circuits have been defined for various functions. Another thinned silicon layer may be found in the stack as item 441. In a non-limiting example, such a layer may have the function of energization of the device. These silicon layers will in some embodiments be electrically isolated from each other through an intervening insulator layer show as item 450. The portions of the surface layers of items 440, 450 and 441 that overlap each other may be adhered to each other through the use of a thin film of adhesive. It may be obvious to one skilled in the arts that numerous adhesives may have the desired characteristics to adhere and passivate the thin silicon layers to the insulator, as in an exemplary sense an epoxy might.

A multiple stacked layer may include additional layers 442, which in an non limiting example may include a thinned silicon layer with circuitry capable of activating and controlling an active lens component. As mentioned before, when the stacked layers need to be electrically isolated from each other, stacked insulator layers may be included between the electrically active layer and in this example item 451 may represent this insulator layer comprising part of the stacked layer insert. In some of the examples described herein, reference has been made to layers formed from thin layers of silicon. The general art may be extended to different embodiments where the material definitions of the thin stacked layers include, in a non limiting sense, other semiconductors, metals or composite layers. And the function of the thin layers may include electrical circuitry, but also may include other functions like signal reception, energy handling and storage and energy reception to mention a few examples. In embodiments with different material types, the choice of different adhesives, encapsulants and other materials which interact with the stacked layers may be required. In an example embodiment, a thin layer of epoxy may adhere three silicon layers shown as 440, 441 and 442 with two silicon oxide layers 450 and 451.

Figure 6:
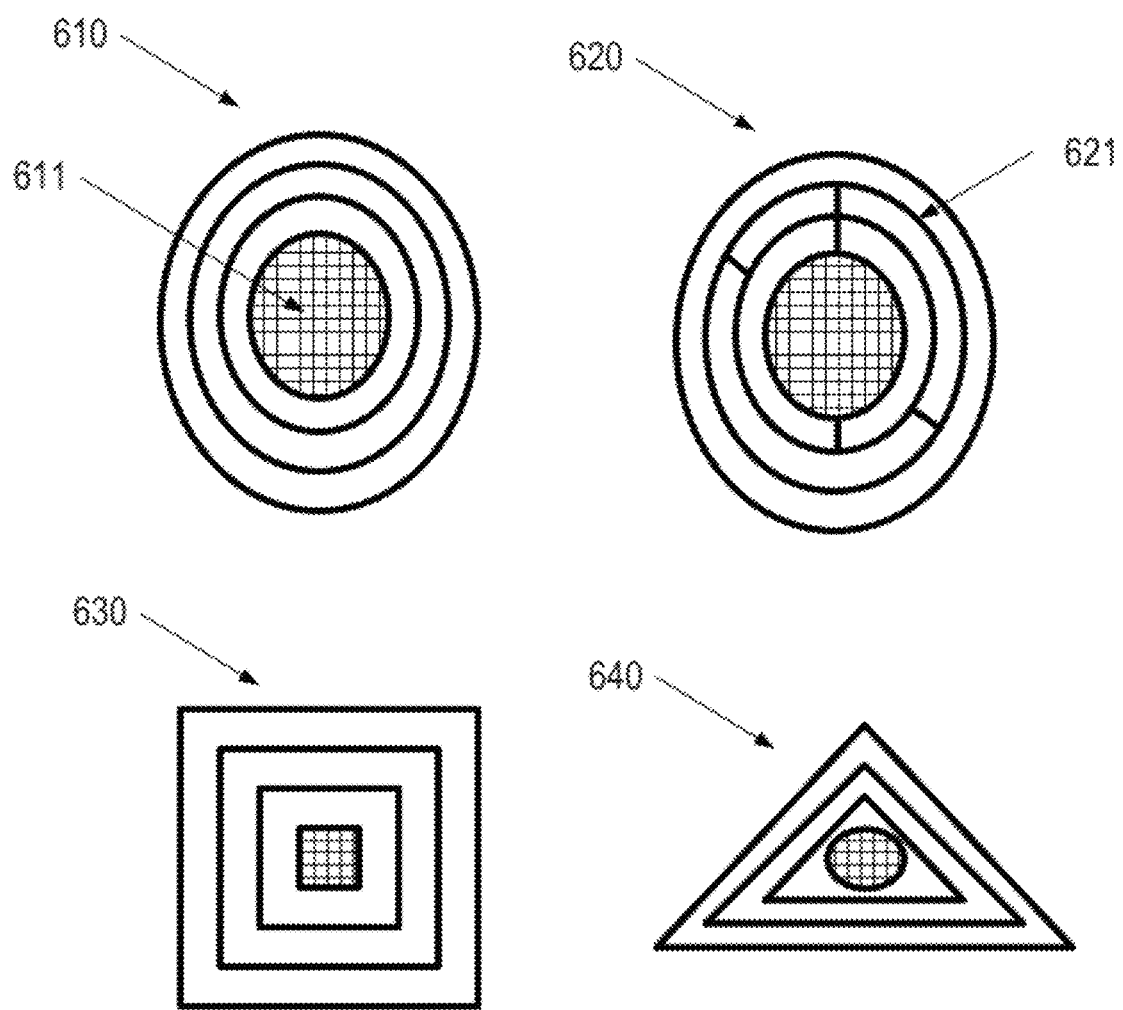
FIG. 6 illustrates different shapes and embodiments of the components used for forming layers in a stacked functional layer insert.

As mentioned in some of the examples the thinned stacked layer may comprise circuits formed into silicon layers. There may be numerous manners to fabricate such layers, however, standard and state of the art semiconductor processing equipment may form electronic circuits on silicon wafers using generic processing steps. After the circuits are formed into the appropriate locations on the silicon wafers, wafer processing equipment may be used to thin the wafers from hundreds of microns thick to thicknesses of 50 microns or less. After thinning the silicon circuits may be cut or "diced" from the wafer into the appropriate shapes for the ophthalmic lens or other application. In later section, different exemplary shapes of the stacked layer invention disclosed herein are shown in FIG. 6. These will be discussed in detail later; however, the "dicing" operation may use various technical options to cut out thin layers with curved, circular, annular, rectilinear and other more complicated shapes.

When the stacked layers perform a function relating to electrical current flow, in some embodiments, there may be a need to provide electrical contact between the stacked layers. In the general field of semiconductor packaging this electrical connection between stacked layers has generic solutions comprising wire bonding, solder bumping and wire deposition processes. Some embodiments of wire deposition may use printing process where electrically conductive inks are printed between two connection pads. In other embodiments, wires may be physically defined by an energy source, like for example a laser, interacting with a gaseous, liquid or solid chemical intermediate resulting in an electrical connection where the energy source irradiates. Still further interconnection definition embodiments may derive from photolithographic processing before or after metal films are deposited by various means.

In the invention herein, if one or more of the layers needs to communicate electrical signals outside itself, it may have a metal contact pad that is not covered with passivating and insulating layers. In many embodiments these pads would be located on the periphery of the layer where subsequent stacked layers do not cover the region. In an example of this type of embodiment, in FIG. 4 interconnect wires 430 and 431 are demonstrated as electrically connecting peripheral regions of layers 440, 441 and 442. It may be apparent to one skilled in the art that numerous layouts or designs of where the electrical connection pads are located and the manner of electrically connecting various pads together. Furthermore, it may be apparent that different circuit designs may derive from the choice of which electrical connect pads are connected and to which other pads they are connected. Still further, the function of the wire interconnection between pads may be different in different embodiments including the functions of electrical signal connection, electrical signal reception from external sources, electrical power connection and mechanical stabilization to mention a few examples.

In a previous discussion, it was presented that non semiconductor layers may comprise one or more of the stacked layers in the inventive art. It may be apparent that there could be a great diversity of applications which may derive from nonsemiconductor layers. In some embodiments, the layers may define energizing sources like batteries. This type of layer in some cases may have a semiconductor acting as the supporting substrate for the chemical layers, or in other embodiments may have metallic or insulating substrates. Other layers may derive from layers which are primarily metallic in nature. These layers may define antennas, thermal conductive paths, or other functions. There may be numerous combinations of semiconducting and non semiconducting layers that comprise useful application within the spirit of the inventive art herein.

In some embodiments where electrical connection is made between stacked layers the electrical connection will need to be sealed after connection is defined. There are numerous methods that may be consistent with the art herein. For example, the epoxy or other adherent materials used to hold the various stacked layers together could be reapplied to the regions with electrical interconnect. Additionally, passivation films may, in some embodiments, be deposited across the entire device to encapsulate the regions that were used for interconnection. It may be apparent to one skilled in the art that numerous encapsulating and sealing schemes may be useful within this art to protect, strengthen and seal the stacked layer device and its interconnections and interconnection regions.

Assembling Stacked Functionalized Layer Inserts

Figure 5:
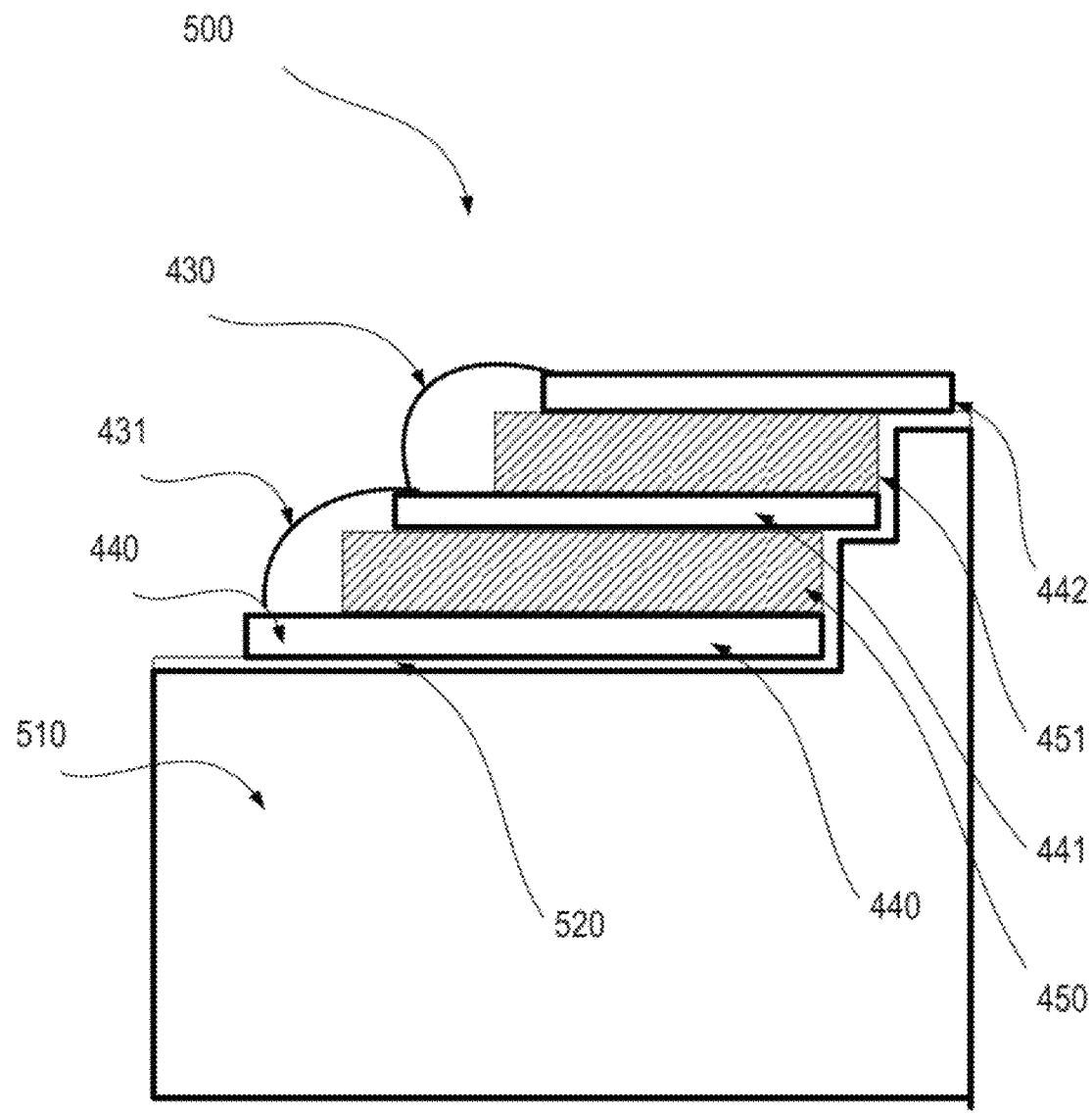
FIG. 5 demonstrates an exemplary embodiment of an insert comprising multiple stacked functional layers upon a supporting and aligning structure.

Proceeding to FIG. 5, item 500, a close up view of an exemplary apparatus to assemble stacked functionalized layer inserts is demonstrated. In the example, a stacking technique where the stacked layers do not align on either side of the layer is shown. Items 440, 441 and 442 again may be silicon layers. On the right side of the FIG. it may be seen that the right side edge of the items 440, 441 and 442 do not align with each other, as they may in alternative embodiments. Such a stacking methodology may allow the insert to assume a three dimensional shape similar to that of the general profile of an ophthalmic lens. In some embodiments as well, such a stacking technique may allow for the layers to be made from the largest surface area as possible. In layers that are functional for energy storage and circuitry such surface area maximization may be important.

In general many of the features of the previously described stacked inserts may be observed in FIG. 5 including stacked functional layers 440, 441 and 442; stacked insulating layers 450 and 451; and interconnections 430 and 431. Additionally a supporting jig, item 510, may be observed to support the stacked functionalized layer insert as it is being assembled. It may be apparent that the surface profile of item 510 may assume a large number of shapes which will change the three dimensional shape of inserts made thereon.

In general, a jig 510 may be provided with a predetermined shape. It may be coated with different layers, item 520, for a number of purposes. In a non limiting exemplary sense, the coating may first comprise a polymer layer that will allow easy incorporation of an insert into the base material of an ophthalmic lens, and may even be formed from a polysilicone material in some embodiments. An epoxy coating may then be deposited upon the polysilicone coating to adhere the bottom thin functional layer 440 to the coating 520. The bottom surface of a next insulating layer 450 may then be coated with a similar epoxy coating and then placed into its appropriate location upon the jig. It may be clear that the jig may, in some embodiments, have the function of aligning the correct placement of the stacked layers relative to each other as the device is assembled. In repetitious fashion, the rest of the insert may then be assembled, the interconnections defined and then the insert encapsulated. In some embodiments, the encapsulated insert may then be coated from the top with a polysilicone coating. In some embodiments that use a polysilicone coating for item 520, the assembled insert may be dissociated from the jig 510 by hydration of the polysilicone coating.

The jig 510 may be formed from numerous materials. In some embodiments, the jig may be formed and made of similar materials that are used to make molding pieces in the manufacture of standard contact lenses. Such a use could support the flexible formation of various jig types for different insert shapes and designs. In other embodiments, the jig may be formed from materials that either in their own right or with special coatings will not adhere to the chemical mixtures used to adhere the different layers to each other. It may be apparent that numerous options may exist for the configuration of such a jig.

Another aspect of the jig demonstrated as item 510 is the fact that its shape physically supports the layers upon it. In some embodiments the interconnection between the layers may be formed by wirebonding connection. In the process of wirebonding significant force may be applied to the wire to ensure it forms a good bond. Structural support of the layers during such bonding could be important and could be performed by the supporting jig 510.

Still another function of the jig demonstrated as item 510 is that the jig may have alignment features on it that allow for the alignment of pieces of the functionalized layers to be aligned both relative to each other linearly and radially along the surfaces. In some embodiments, the jig may allow the alignment of azimutal angle of the functional layers relative to each other around a center point. Regardless of the ultimate shape of the insert produced it may be apparent that the assembly jib may be useful in insuring that the pieces of the insert are properly aligned for their function and correct interconnection.

Proceeding to FIG. 6, a more generalized discussion of shapes of stacked layer inserts may be had. In a subset of the generality of shapes consistent with the art, some sample variation in shape is shown. For example, item 610 shows a top view of a stacked insert which has been formed from essentially circular layer pieces. In some embodiments, the region shown with cross hatching 611 may be an annular region where layer material has been removed. However, in other embodiments, it may be apparent that the pieces of the stacked layers used form the insert could be disks without an annular region. Although, such a non annular insert shape may be of limited utility in an ophthalmic application the spirit of the inventive art herein is not intended to be limited by the presence of an internal annulus.

Item 620 may in some embodiments demonstrate different embodiments of a stacked functional layer insert. As shown in item 621, in some embodiments the layer pieces may be discrete not only in the stacking direction but also around the azimuthal direction perpendicular to the stacking direction. In some embodiments, semicircular pieces may be used to form the insert. It may be apparent that in shapes that have an annular region, which partial shapes could be useful to reduce the amount of material that would need to be "diced" or cut out after the layer material is formed into its function.

Proceeding further, item 630 demonstrates that non radial, non elliptical and non circular insert shapes could be defined. As shown in item 630, rectilinear shapes may be formed, or as in item 640 other polygonal shapes. In a three dimensional perspective pyramids, cones and other geometrical shapes could result from the different shapes of the individual layer pieces used to form the insert. In the three dimensional perspective it may be noted that the individual layers which have heretofore been represented as planar or flat layer piece themselves may assume degrees of freedom in three dimensions. When the silicon layers are thinned sufficiently they are able to bend or contort around their typical flat planar shape. This additional degree of freedom for thin layers allows for even further diversity of shapes that may be formed with stacked integrated component devices.

In a more general sense it may be apparent to one skilled in the arts that a vast diversity of component shapes may be formed into device shapes and products to make stacked integrated component devices, and these devices may assume a wide diversity of functionality, including in a non limiting sense energization, signal sensing, data processing, communications both wired and wireless, power management, electromechanical action, control of external devices and the broad diversity of function that layered components may provide.

Powered Layers

Figure 7:
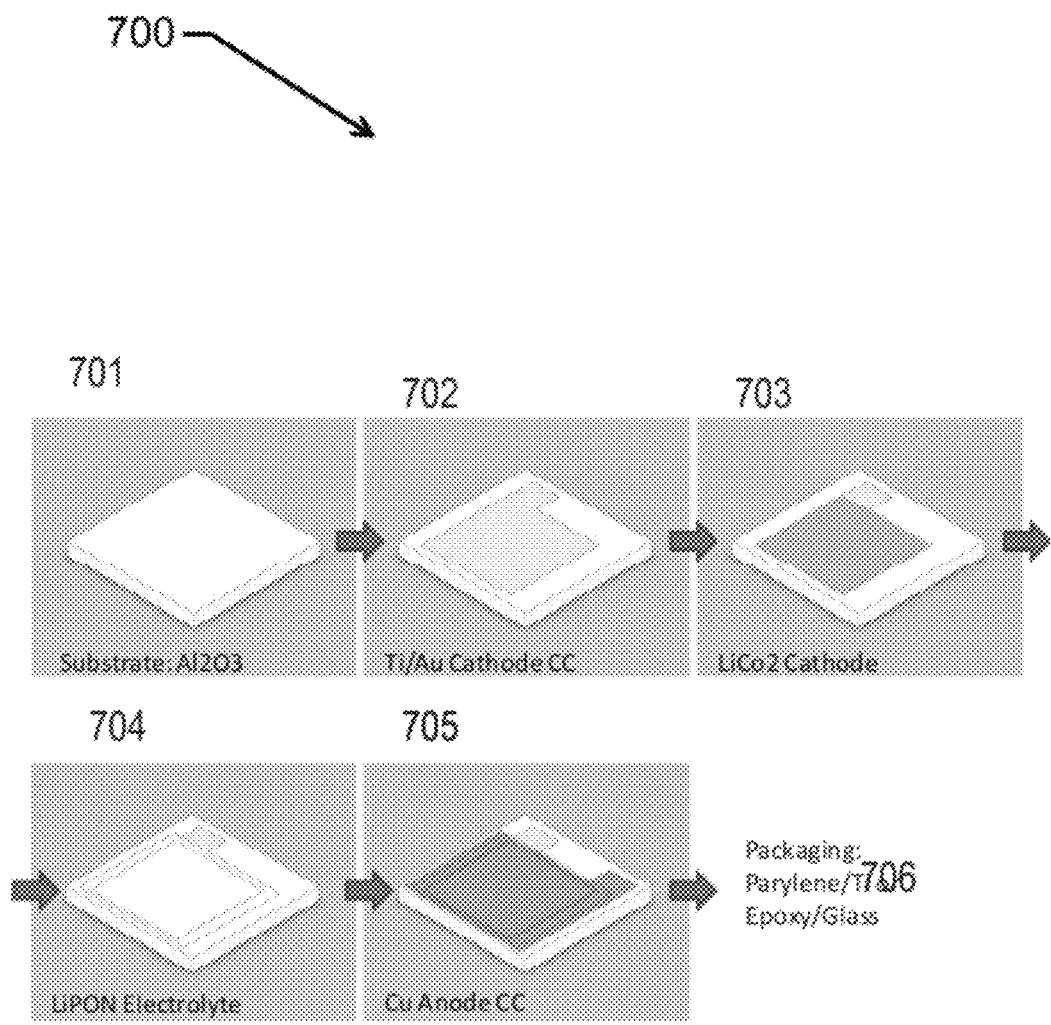
FIG. 7 illustrates a block diagram of some embodiments of a power source layer.

Referring now to FIG. 7, item 700, in some embodiments, one or more layers of a functionalized stack of substrates may include a thin film electrical power source, 706. The thin electrical power source may be viewed essentially as a battery on a substrate.

A thin film battery (sometimes referred to as a TFB) may be structured on a suitable substrate, such as silicon, using known deposition processes to deposit materials in thin layers or films. In some embodiments the deposition process for one of these thin film layers may include, sputter deposition and may be used to deposit various materials. After a film is deposited, it may be processed before a next layer is deposited. A common process on a deposited film may include lithography or masking techniques that then allow etching or other material removing techniques to be performed thus allowing the film layer to have a physical shape in the two dimensions of the substrate surface.

In FIG. 7, item 700 an exemplary thin film processing flow may be depicted. A thin film battery will typically be built upon a substrate, in this flow the substrate is depicted in an exemplary sense as an Aluminum Oxide ($Al_2O_3$), item 701. A typical layer for electrical contact may next be deposited upon the substrate as shown in the FIG. 7 as item 702 where a cathode contact may be formed by a thin film deposition of Titanium and Gold upon the substrate. As may be apparent in FIG. 7 this film may then be patterned and etched, for example by a sputter etch technique or a wet etch technique to yield the shape as shown in item 702. A next step in an exemplary process would be to form the cathode layer as a film upon the cathode contact, item 703. One of the commonly utilized cathode films may include Lithium Cobalt Oxide ($LiCoO_2$) and as shown in FIG. 7, it too may have patterning processes performed upon it. A next step, as shown as item 704, may be to deposit a thin film to form an electrolyte layer in the battery. There may be numerous material choices and forms for the electrolyte layer, but in an exemplary sense a polymer layer of Lithium Phosphorous OxyNitride (LiPON) may be used. Proceeding further to item 705, the thin film stack may be further processed with a deposition of Lithium for an anode layer and then a copper layer to act as the anode contact layer and like the other layers then imaged for an appropriate shape for contact features or other similar features. The thin film battery may in some embodiments then be realized by encapsulating the film stack in passivation and sealing layers. In exemplary fashion, the layers may be encapsulated with Parylene and Titanium or with Epoxy and Glass layers as shown in item 706. As with other layers there may be patterning and etching of these final layers, for example to expose features where the encapsulated battery may be electrically contacted. It may be apparent to one skilled in the art, that there are an abundant set of material choices for each of the layers that may define embodiments within the spirit of the art disclosed herein.

As described for item 706, some embodiments will include enclosure in packaging to preventingress of one or more of: oxygen, moisture, other gasses, and liquids. These embodiments may therefore include packaging in one or more layers which may include one or more of an insulating layer, which as a non-limiting may include for example Parylene, and an impermeable layer, which may include for example metals, aluminum, titanium, and similar materials which form an impermeable film layer. An exemplary means of forming these layers may include application by deposition onto a formed thin film battery device. Other methods of forming these layers may include applying organic materials, as for example epoxy, in conjunction with pre-shaped impermeable materials. In some embodiments, the pre-shaped impermeable material may include the next layer of the integrated component device stack. In other embodiments, the impermeable material may include a precision formed/cut glass, alumina, or silicon cover layer.

In some embodiments, such as for example, a stacked integrated component device for an ophthalmic device; a substrate may include one that is able to withstand high temperatures, as for example 800 deg. C., without chemical change. Some substrates may be formed from material which provides electrical insulation and alternatively some substrates may be electrically conductive or semi-conductive. These alternative aspects of the substrate material, nonetheless, may be consistent with a final thin film battery that may form a thin component which may be integrated into a stacked integrated component device and provide at least in part the energization function of the device.

In some embodiments of a thin film battery where the thin film battery is a thin component of a stacked integrated device, the battery may have connection to the other thin components through access with opening in the passivation films at the contact pads shown as items 750 on item 706 of FIG. 7 item 700. In additional embodiments, contact may be made through contact pads on the reverse side of the substrate from that shown for items 750. Contact pads on the reverse side could be electrically connected to the thin film battery through the use of a via that is formed through the substrate which has a conductive material on the via sidewalls or filling the via. Finally, there may also be embodiments where both contact pads on the top and bottom of the substrate are formed. Some of these contact pads may intersect the contact pads of the thin film battery, but alternative embodiments may include contact pads through the substrate where no connection is made to the battery. As may be apparent to one skilled in the arts, there may be numerous manners to interconnect through and to interconnect within a substrate upon which a thin film battery is formed.

A set of differing embodiments of the art presented herein may relate to the functions that the electrical connections may perform. Some interconnections may provide an electrical connection path for components within the stack of integrated component devices and their interconnection with devices outside the integrated component device stack. In some of the embodiments that relate to connection outside of the device stack; this connection is made via a direct electrical conduction path. Still other embodiments derive when the connection outside of the package is made in a wireless manner; wherein the connection is made through a manner including radio frequency connection, capacitive electrical communication, magnetic coupling, optical coupling, or another of the numerous means that define manners of wireless communication.

Wire Formed Power Source

Figure 8:
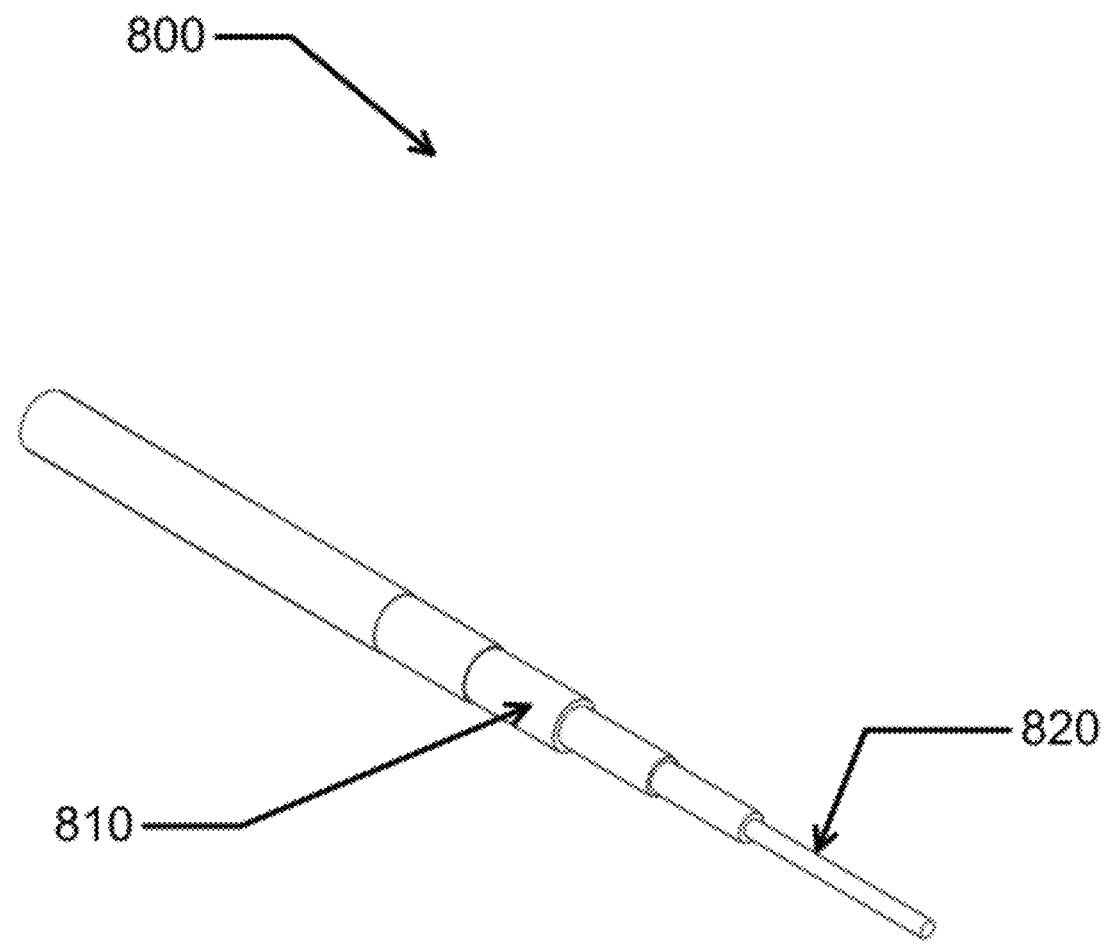
FIG. 8 illustrates an exemplary embodiment of form factor for a wire based power source.

Referring now to FIG. 8, an exemplary design of some embodiments of a power source 800 that can include a battery 810 formed about a conductive wire 820 is depicted. In some embodiments, item 820 may include a fine gauge copper wire, which may be used as a support. Various battery component layers, which schematically are demonstrated as the rings evident in item 810, may be built up using batch or continuous wire coating processes. In this manner, a very high volumetric efficiency, which may in some embodiments reach or exceed 60% of active battery materials, can be achieved in a convenient form factor that is flexible. In some embodiments, a thin wire may be utilized to form small batteries, such as, in a non-limiting example, a battery whose stored energy may include a range measured by milliamp hours. The voltage capability, in some embodiments of such a wire based battery component, may be approximately 1.5 volts. It may be apparent to a skilled artisan, that larger batteries and higher voltages may also be scaled, for example by designing the end device to connect single batteries in parallel or in series. The numerous manners in which the inventive art may be used to create useful battery devices are within the scope of the present invention.

Figure 9:
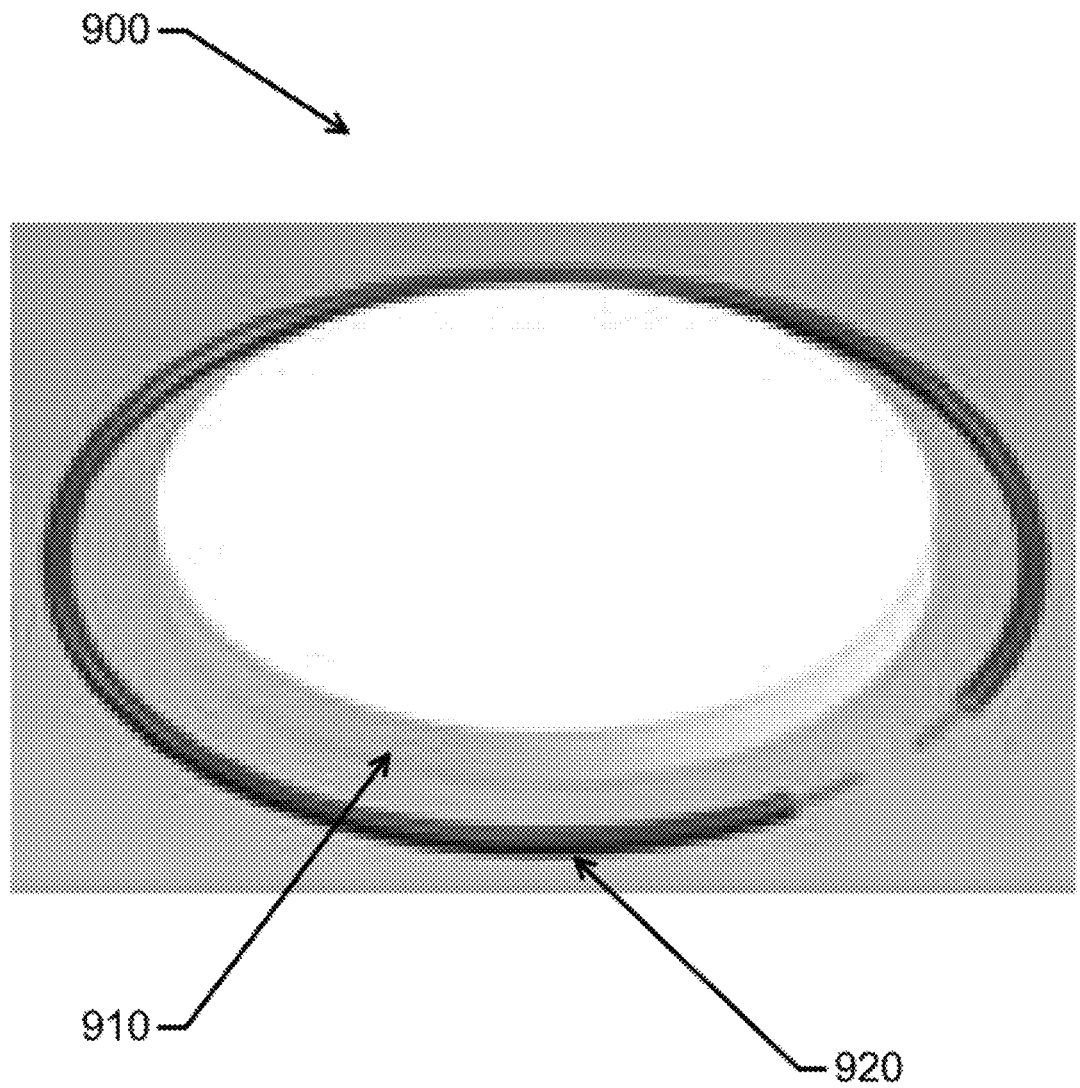
FIG. 9 illustrates the shape of an exemplary wire based power source relative to an exemplary ophthalmic lens component.

Referring to FIG. 9, item 900, a depiction of how a wire based battery component may be combined with other components to create embodiments of the inventive art is made. In an example, item 910 may represent an ophthalmic device whose function may be controlled or altered by electrical means. When such a device can be part of a contact lens, the physical dimensions that components occupy may define a relatively small environment. Nevertheless, a wire based battery; item 920 may have an ideal form factor for such an embodiment, existing on the periphery of such an optical component in a shape that a wire may be formed into.

Figure 10:
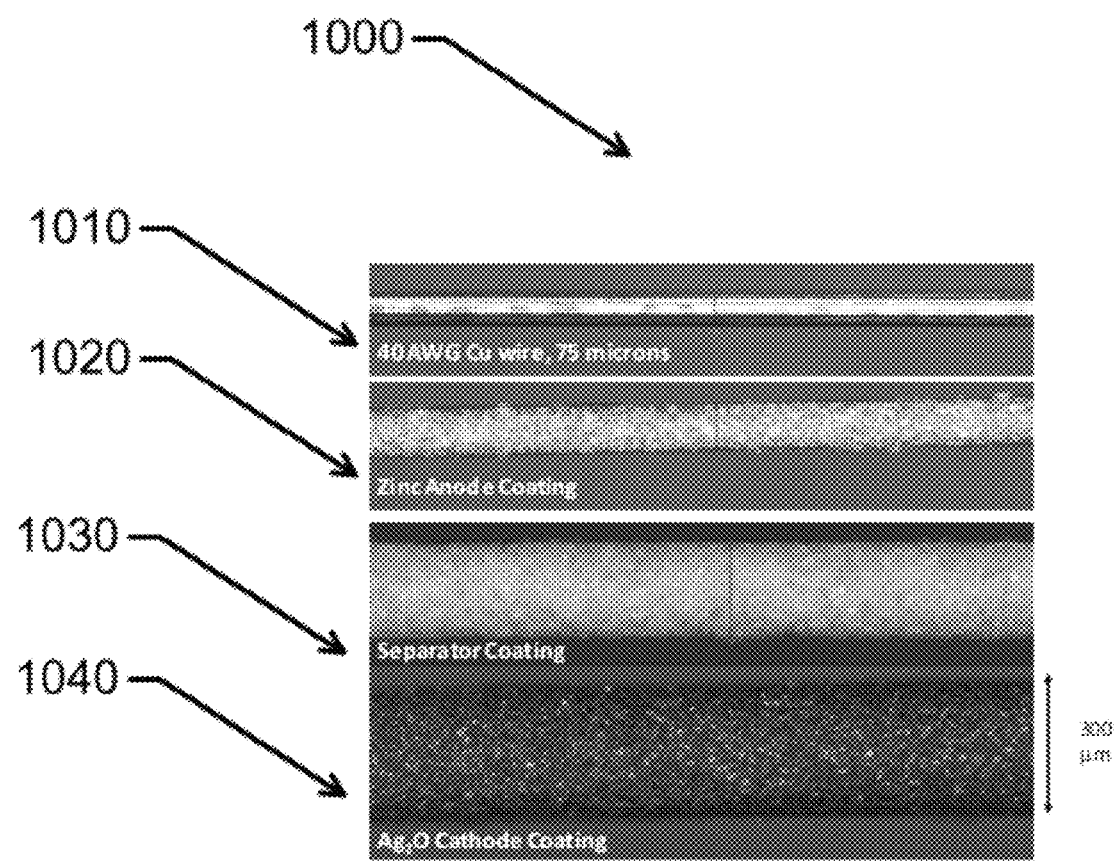
FIG. 10 illustrates a cross sectional diagram of the radial film layers of an exemplary wire based power source.

Referring now to FIG. 10, item 1000, the result of processing using an exemplary method for forming wire batteries is illustrated. These methods and the resulting products define some embodiments of a wire based battery. Initially, a copper wire, item 1010, of high purity such as those available from a commercial source, for example McMaster Carr Corp. may be chosen and then coated with one or more layers. It may be apparent that there exist numerous alternatives of the type and composition of the wire that may be used to form wire based batteries.

In some embodiments, a zinc anode coating may be used to define an anode for the wire battery as shown as item 1020. The anode coating may be formulated from zinc metal powder, polymer binders, solvents, and/or additives. The coating may be applied and immediately dried. In some embodiments, multiple passes of the same coating may be used to achieve a desired thickness.

Continuing with FIG. 10, the anode and cathode of the wire battery may be separated from each other. A separator coating, item 1030, may be formulated from non-conductive filler particles, polymer binders, solvents, and additives. In some embodiments, the method of application of the separator may be a coating application method similar to that used to coat the anode layer 1020.

A next step in processing the exemplary wire battery of item 1000 is forming a cathode layer. In some embodiments this cathode, item 1040 may be formed with silver oxide cathode coating. This silver oxide coating may be formulated from $Ag_2O$ powder, graphite, polymer binders, solvents, and additives. In similar fashion to the separator layer, a common coating application method may be used as was used for other layers of the wire battery.

After a collector is formed, the exemplary wire battery may be coated with a layer to collect current from the cathode layer. In some embodiments, this layer may be a conductive layer from a carbon impregnated adhesive. In other embodiments, this layer may be a metal, for example Silver, impregnated adhesive. It may be apparent to one skilled in the art that there are numerous materials that may support forming a layer to enhance the collection of current along the battery surface. Electrolyte (as for example, potassium hydroxide solution with additives) may be applied to the assembled battery to complete construction in some embodiments.

In some embodiments of a wire battery, the layers that are used to form the battery may have an ability to evolve gasses. In these embodiments, the materials that form the battery layers may have a sealant layer placed around the battery layers to contain the electrolyte and other materials within the confines of the battery and to protect the battery from mechanical stresses. Nevertheless, for embodiments that may evolve gasses, this sealant layer is typically formed in a manner that allows the diffusion of the evolved gasses through the layer. In some embodiments, such a sealant layer may include silicone or fluoropolymer coatings; however, any material which is used in the state of the art to encapsulate batteries of this type may define embodiments within the scope of the art defined herein.

Components of Stacked Multilayer Interconnection

As mentioned in prior description, the layers of a stacked integrated component device may typically have electrical and mechanical interconnections between them. Some embodiments have been described where certain interconnection schemes, as for example wire bonds, are included in sections preceding this discussion. Nevertheless, it may be helpful to summarize some of the types of interconnection in their own right to help in explanation of the art.

One of the common types of interconnection embodiments derives from the use of a "solder ball." A solder ball interconnection is a type of packaging interconnection that has been used for decades in the semiconductor industry, typically in so-called "flip chip" applications where chips are connected to their packaging by inverting a diced electronic "chip," that has deposited solder balls on its interconnections, onto a package that has aligned connection pads to connect to the other side of the solder ball. Heat treatment may allow the solder ball to flow to a certain degree and form an interconnection. The state of the art has continued its progress so that the solder ball type of interconnection may define an interconnection scheme that occurs on either or both sides of a layer. Additional improvement has occurred to decrease the dimension of solder balls that may reliably be used to form interconnections. In some embodiments, the size of the solder ball may be 50 microns in diameter or smaller.

When a solder ball interconnection is used between two layers, or more generally when an interconnection scheme is used that creates gaps between two layers, some embodiments use a process step of "underfill" to place adhesive material into the gaps to provide adhesive mechanical connection and mechanical support of the two layers. There are numerous manners to underfill a set of layers that have been interconnected. In some manners the underfill adhesive is pulled into the gap area by capillary action. In other embodiments, the underfill adhesive may be made to flow into a gap by pressurizing the liquid into the gap region. Still other embodiments may derive by forming an evacuated state in the gap area by pulling a vacuum upon the layered device and then following this with application of the underfill material. Any of the numerous manners to underfill a gap in two layered materials are consistent with the art herein described.

Another evolving technology of interconnection relates to interconnection of one side of a layered component to the other side by a via that cuts through the layer—such a feature is typically called a through via. The technology has also been around for decades in various forms; however the state of the art has improved where very small vias in the 10 micron or less diameter dimension are possible with extremely large aspect ratios possible as well, especially when the layered material is formed of Silicon. Regardless of the layer material, a through via may form an electrical interconnection between the two surfaces of a layer with a metallic; however, when the layer is a conductive or semiconductive material, the through via must have an insulator layer insulating the metallic interconnection from the layer itself. In some embodiments the through via may penetrate through the entire layered substrate. Other embodiments may have the through via penetrate the substrate but then intersect with a deposited feature on the surface of the substrate; from the back side.

In some embodiments of through vias where the via intersects with a metal pad on one side of the layer that metal pad may be interconnected to a different layer with numerous manners including solder balls and wire bonds. In other embodiments where the via can be filled with metal and penetrates the entire layered substrate it may be useful for interconnections to be formed by solder balls on both sides of the interconnecting via.

Another embodiment of interconnection occurs when a layer is formed which only has through vias and metal routing line upon it. In some cases, such an interconnection device may be called an interposer. Since the interposer layer may only have metal routings and via interconnections there are some additional materials that the layer may be made of and therefore alternative embodiments for how to create through vias in these materials may derive. As a non-limiting example, a silicon dioxide or quartz substrate may be the material of the layer. In some cases this quartz layer may be formed by pouring melted quartz upon a substrate where metallic filaments protrude from the surface. These protrusions then form the metallic connections between the top and bottom surface of the quartz layer that results from this type of processing. The numerous manners of forming thin interconnecting layers comprise art useful in interconnecting stacked layers and therefore in the forming of stacked integrated component devices.

Another type of interconnection element is derived from the through substrate via art. If a through substrate via is filled with various layers including metal layers the resulting via may form a structure that can be cut. In some embodiments the via may be cut or "diced" down its center forming a cut out half via. Some embodiments of this type may be termed castellation interconnections. Embodiments of these types provide connection from a top surface to a bottom surface and the ability of interconnections from these surfaces; but as well the potential for interconnection from the side may derive from the structure of the "Castellation."

A number of interconnection and component integration technologies have been discussed herein and in a general perspective these may relate to embodiments that are within the scope of the inventive art herein. Nevertheless, the invention disclosed herein is intended to embrace a wide diversity of integration technologies and the examples, which are intended for illustration purposes, are not intended to limit the scope of the art.

Stacked Integrated Component Device with Energization

Figure 11:
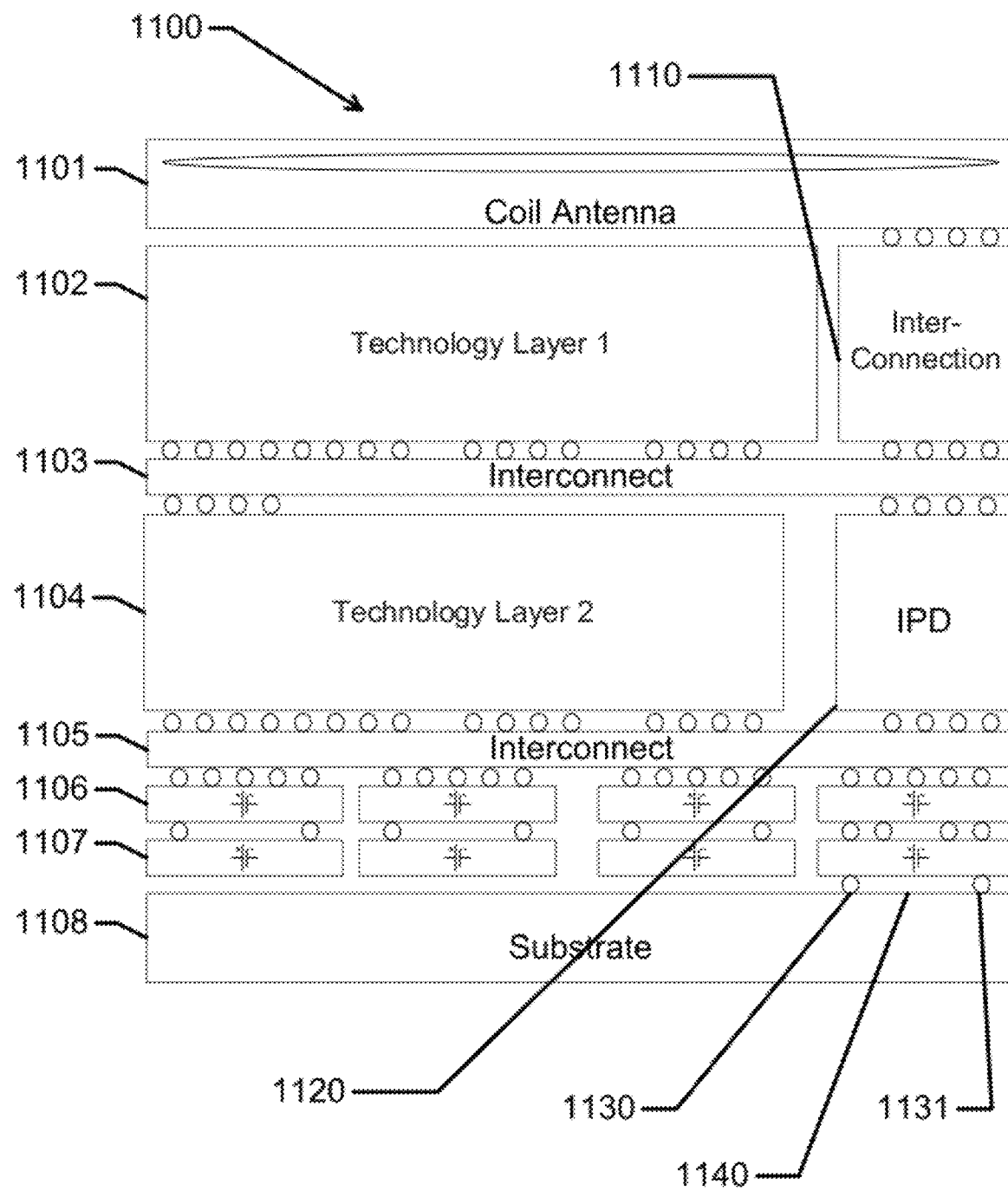
FIG. 11 illustrates an exemplary stacked integrate component device with components from multiple technologies and energization sources.

Proceeding to FIG. 11, an exemplary stacked integrated component device is portrayed as item 1100. As can be seen, item 1100 may be comprised by 8 individual layers that are identified as items 1101-1108 in the figure. These layers will be described in more detail, but it is clear that additional or fewer layers may be possible within the scope of the invention.

The stacked integrated component device of item 1100 may have a substrate base as shown in item 1108. In some embodiments, such a substrate base may provide a function of mechanical support for the device. In other embodiments, such a layer may provide both a mechanical support function and an encapsulation function, as other layers, for example 1107, of the device are connected and sealed upon the substrate, 1108. Item 1100 has numerous interconnections depicted between the layers and items 1130 and 1131 identifies an example rendering of such an interconnection. Although the numerous manners of interconnection may provide this function, it may be helpful to view these interconnections as solder balls in an exemplary manner. Items 1130 and 1131 may be an electrical connection between items 1108 and 1107 or they may function for a mechanical interconnection between the layers. Additionally, the space between items 1130 and 1131 is identified as item 1140. This item is intended to represent the fact that the space in between layers may be underfilled with an adhesive in some embodiments to provide mechanical connection and layer support.

In some embodiments, the substrate layer, 1108, may have electrically active functions. This may derive from the substrate having electrical circuitry upon it, as may be the case if the substrate was a semiconductor substrate with integrated electronic circuitry on it. Alternatively, electrical function may derive from the substrate having deposited layers of conductive material to perform functions such as defining antennas or passive electrical devices as for example capacitors and resistors. Still further electrical active function may derive if the substrate is a metallic layer where the entire layer could provide an electrical ground connection or an electrical shielding for the stacked integrated device.

The substrate layer, 1108, may in some embodiments also provide a function of providing thermal communication of the stacked integrated device to its environment. In some such embodiments, the layer may be formed of a highly thermally conductive metallic substrate capable of allowing high flows of thermal energy to flow across it. In alternative embodiments the substrate may act to insulate the device stack from the environment below it. In some of these examples, there may also reside within the substrate layer the ability to sense the environment below the stacked integrated device both for thermal and non-thermal characteristics. There may be numerous functions that the bottom layer of a stacked integrated component device may perform.

Proceeding to an exemplary layer, item 1103, in the middle of the stacked integrated component device, item 1100, an interconnection layer may be present. Such a layer may have numerous electrical connection locations upon it. In some embodiments, this layer may serve the function of an electrical "Bus" or routing device allowing signals from various components to be interconnected. In some embodiments, electrical devices from layers either above or below the interconnection device may be connected to each other. In other embodiments, signals may flow through the body of the interconnect layer and route between the layers above and below the interconnect device as schematically indicated by the "solder ball" features shown above and below layer 1103. In some embodiments such an interconnection layer may be a layer comprised of a mechanical substrate with vias and metallic routing lines where control of these routing lines is performed by circuitry above or below the interconnect plane. However, alternatives may exist where the layer 1103 also has active electrical functions to act for controlling signal and power routing or for effecting electrical signals, as may be the function of passive devices like resistors, capacitors and inductors for example. In a similar fashion, item 1105, may in some embodiments provide routing and mechanical support as an interconnect layer connecting electrical devices from one layer, for example 1104, with other types of electrical devices such as a battery layer that may be illustrated as layer 1106. In a still further additional embodiment type of interconnect layer, item 1110, may define an interconnect device that occupies only a portion of the space available in a layer, for example item 1102. It may be apparent that numerous interconnect layers and types of interconnect layers may comprise an important function in stacked integrated devices.

In some embodiments, passive devices may be added to the stacked integrated component device as a layer or portion of a layer discrete from the technology layers. In these devices, as for example item 1120, one or more passive devices may be incorporated into a layer device in its own right. In some embodiments, this passive layer device may be formed in an integrated processing fashion where the devices are processed into the substrate material. In other embodiments, the layer may be formed from discrete passive components assembled onto an appropriate layer form. In some cases, the performance of the passive devices may be superior when processed in this manner to a similar passive device formed as part of the integrated CMOS or other technology layers. Another motivation may be a lowered cost structure. Numerous types of passive devices may be consistent with the art herein including in a non-limiting exemplary sense, resistors, capacitors, diodes, fuses, inductors, transformers, antennas, and suppressors.

The integrated passive device layer may incorporate the diversity of the interconnection purposes that an interconnect device layer may perform. As indicated in FIG. 11, item 1100 the integrated passive device, item 1120 may in some embodiments connect to other layers through solder ball connections. As well, the device may include through substrate connection elements that allow the device to connect to both layers above and below it, or to pass signals through it. As may be apparent to one skilled in the arts, the integrated passive device function may be performed in a dedicated layer location as shown in the embodiment of item 1100; however, as well, there may be a number of such devices incorporated and be within the intent of the inventive art herein.

An important function in some stacked integrated component device embodiments may be performed by the integrated circuit s incorporated into the device. Schematically, these devices are represented by the technology layers identified as items 1102 and 1104. In some embodiments where there may be multiple technology layers, the stacked integrated component device may have technology that differs in the separate layers. In an exemplary sense, the technology of layer 1 item 1102 may in some embodiments derive from a CMOS technology processing flow; while the technology of layer 2, item 1104 may derive from a BiCMOS technology processing flow. It may be apparent to one skilled in the arts that numerous technology combinations may be possible including mentioning a few examples, CMOS, BiCMOS, Bipolar, MEMS, Memory Device and other technology consistent with producing a function on a substrate consistent with layer formation.

In some embodiments, the technology type of items 1102 and 1104 may be similar but come from a different family within that technology definition. For example, Item 1102 may be formed in a 0.5 micron CMOS processing flow; whereas Item 1104 may be formed in a 20 nanometer CMOS processing flow in a non-limiting exemplary sense. An exemplary motivation for splitting device function into two separate technology blocks may include the cost effectiveness of the resulting multicomponent device. In other embodiments, the motivation may include technology improvements that a particular technology node would offer the device; including for example that the power draw of some critical function may be dramatically lowered by its design being in an advanced narrow linewidth technology. In other embodiments, the two layers may be from the same technology node and the same technology type but represent different circuit designs within those technology and technology node. In still further embodiments, the substrates used to form the technology layer itself may differ; as for example would be the case if technology layer 1, item 1102 were formed upon a standard silicon substrate and technology layer 2 were formed upon a substrate that derives from a different substrate including in a non-limiting sense a silicon on insulator substrate, or a non-Silicon semiconductor substrate, or an organic electronic device substrate as some examples. In a more general sense, it may be clear to one skilled in the arts that a very wide combination of technology types, designs and nodes may be combined into embodiments of one or more technology layers and include art consistent with the invention herein.

In some embodiments, the technology layer may be formed from a standard thinned substrate layer produced in a particular technology family, where interconnection to the device layer may occur through one side of the layer as is depicted in device 1102. In other embodiments, the technology layer may include through layer interconnection to allow both sides of the layer to interconnect with layers above and below itself, as depicted in item 1104. It may be obvious to one skilled in the art, that the similar diversity of interconnection schemes as has been previously described may be consistent with the inventive art herein.

In the discussions of the stacked integrated component devices herein, the descriptions and drawings of layers may derive from planar layers that are assembled into the various forms and shapes that have been described including those examples shown in FIG. 6. It may be important to note however that the thin layers may also be formed into non-planar layer shapes as well. There may be numerous manners to form such non planar shapes ranging from deformation of the thin layer structures into a three dimensional shape to dicing the layers in such a way that non planar shapes may be formed by deforming the thin layered shape. Therefore, the scope of the description is meant to embrace the diversity of three dimensional form factors that a layered device formed from stacked integrated component devices may define.

Proceeding to the top layer of item 1100, as shown as item 1101, this layer may have similar additional functions due to its geometry of being on top of the other layers that the substrate layer 1108 has by being on the bottom of the layer stack. Therefore, it may have similar embodiments to those discussed for layer 1108. In the example of item 1100, the top layer may function to provide wireless communication of signals and power in and out of the stacked integrated component device through use, for example of a coiled antenna feature. Item 1101 is depicted as having wired connections only to the layer below itself in this exemplary embodiment. Nevertheless, it may alternatively be possible for interconnections external to the device to occur on this layer in some embodiments as well. It may be apparent that the top layer in some embodiments may actually perform any of the layer type functions that have been described herein.

Figure 12:
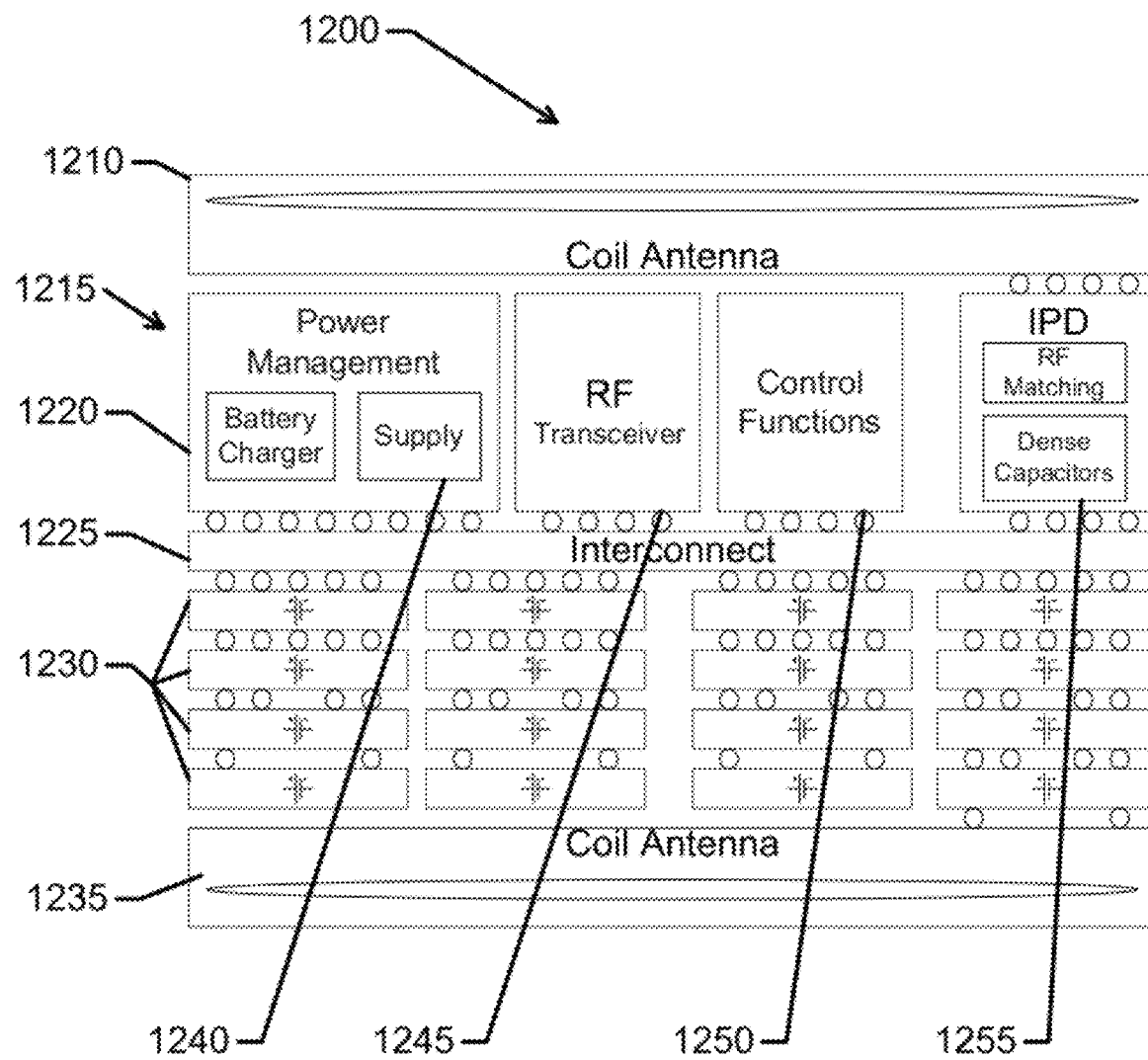
FIG. 12 illustrates an additional stacked integrated component device embodiment with energization.

Proceeding to FIG. 12, item 1200 an exemplary embodiment similar to that of item 1100 is demonstrated. This embodiment shows a Stacked Integrated Component Device with energization where there are 8 stacked layers present. There is a top layer 1210, which asks as a wireless communication layer. There is a technology layer 1215, which connects to the top layer 1210 and to an interconnect layer 1225 below it. Furthermore, there are 4 battery layers depicted as item 1230. In some embodiments, there would be a lower substrate layer, item 1235 where the substrate includes an additional antenna layer. There may be numerous functions that an embodiment like this could perform; however, in a non-limiting exemplary sense one function could be the function of an RF Signal repeater.

In the exemplary function as an RF Signal repeater, item 1210 may function as follows in some embodiments. The stacked integrated component device has energization capabilities. The stored energy resides in the battery layers of item 1230. There may be numerous ways to configure the battery elements of layer 1230; however, an example would be where a stack of four elements would be connected in a parallel configuration to yield an operating voltage in a 3.6V regime. The four stacks of four elements could likewise be connected in a parallel configuration where the energy output from each stack is fed through the interconnect layer 1225 to the Power Management device, 1220, in the technology layer 1215. The power management device 1220 may in some embodiments have a sense function that will determine whether all of the battery chains are fully functional and isolate any low charged or non-functional battery chains from the others. In some embodiments, device 1220 may also take the input voltage of 3.6 V and provide a Power Supply function, 1240, by altering the operating voltage to a 2.5 Volt supply which it would output to the power supply connections and distribution network of item 1225, the interconnect layer. This supply voltage may power the RF Transceiver, 1245, the Control Function Device, 1250 and provide the power supply connections to the integrated passive device item 1255. In some embodiments, the power supply may charge capacitors located in the integrated passive device, 1255. These capacitors may serve the function of buffering power demands as the other technology devices draw power. Although specific details of this embodiment have been discussed, it may be clear that significant additional embodiments may be possible with the type of design represented by item 1200.

In some embodiments, when the energy supply system is fully charged and the power management unit is providing appropriate output power, device 1200 may function as a signal repeater as follows. The coil Antenna of item 1210 may be designed to be tuned to a frequency; which may in this embodiment be 2.44 GHz for example. Continuing the exemplary embodiment, additional filtering stages may be found for a passive device based RF filter also tuned to 2.44

GHz. Signals detected at this frequency may be shuttled along the interconnect device 1225 to the RF transceiver, 1245 of the technology layer 1215. The RF Transceiver, 1245, may as well be tuned to a spectrum of frequencies around 2.44 GHz. When the transceiver, 1245 detects signals on in this spectral range it may then in some embodiments provide an amplification function on the signals and then retransmit them as well as sending a control signal to the control function device 1250. When the control function, 1250, receives the appropriate control information from device 1245 it may then route the output of the RF Transceiver 1245, through the interconnect layer 1225, along through vias in the battery elements of item 1230 to the antenna of level 1235 for retransmission. At the same time that the RF Signal repeater function is being performed in the exemplary device 1200, another parallel function of battery recharging may be occurring. In a similar manner to the previous discussion, there may be an antenna in the top layer 1210 tuned to a different higher frequency of 15.5 MHz for example. When this signal is routed through the Integrated Passive device, 1255, it may be sent through to the interconnect layer 1225 and then on to the Power Management device 1220. The Power Management device may take the power from this signal and then convert the signal from an AC signal to a DC Charging signal. It may then switch one of the battery units of layer 1230 from providing power to being charged. In this manner the stacked integrated component device, 1200, in some embodiments may be performing a function and may be reenergized at the same time. The embodiment discussed in relationship to item 1210 is one of many embodiments that may derive from the inventive art discussed herein; its description is focused on describing how some exemplary parts of a stacked integrated component device may function in a functional embodiment.

Figure 13:
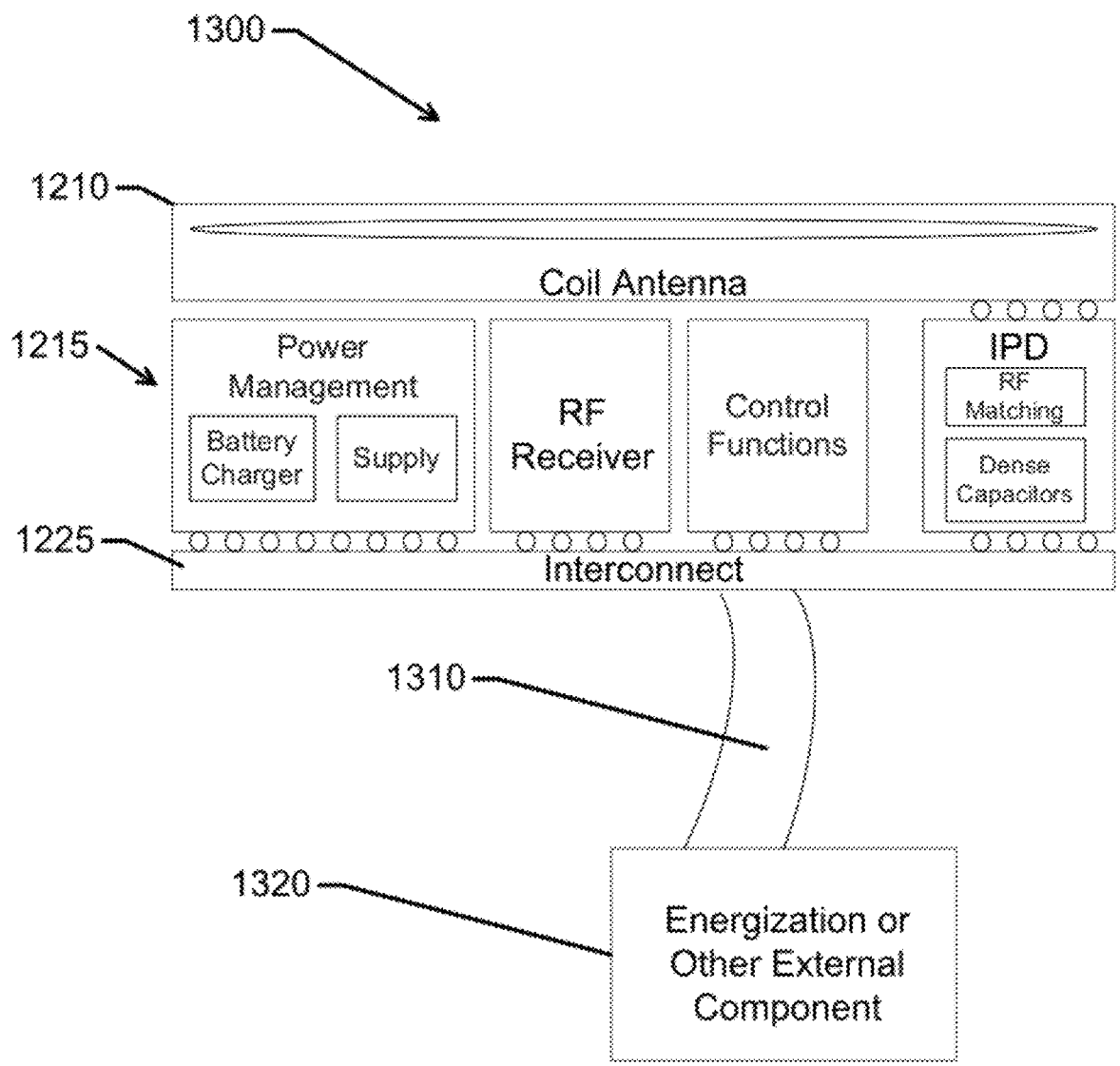
FIG. 13 illustrates an additional stacked integrated component device embodiment with energization where additional components are integrated outside the component stack.

Proceeding now to FIG. 13, item 1300 another exemplary embodiment may be described. As may be observed in the figure, the layers of item 1300 may exhibit similarity to the previously discussed item 1200. And, as an example a similar type of functioning of the device layer as described for item 1200 may in some embodiments be operant in item 1300. However, There may be a lessened number of layers, the antennal layer 1210 on top of the stacked integrated component device, a technology layer 1215 with similar devices as item 1200, and an interconnect substrate layer item 1225. An important difference, in some embodiments, of item 1300 may come from the external connection of both energization components and other external components as shown by item 1320. Recalling the wire battery component of item 920; the energy storage for the stacked integrated component device 1300 may exist as the element of item 1320. It may be connected via a wire bond connection in some embodiments to the interconnect layer 1225. An additional function of such a wire battery in some embodiments may be for the wire to function as an antenna device as well. Therefore, the transmission signal produced by the technology layer 1215 may be routed to the battery wire as well. In this embodiment, an external power device and the externally connected components may be defined by a wire battery 1320, however it may be apparent to one skilled in the art that multiple separate devices may be externally connected within the scope of this art; and furthermore, that a variety of battery type devices including, without limitation, flat planar batteries of the type described as the output of processing flow 700 may be utilized and also be within the scope of the art contained herein.

Ophthalmic Lenses May Incorporate Stacked Integrated Component Device with Energization Amongst the significant diversity of applications and functions that a stacked integrated component device with energization might perform, an interesting subset of these varied embodiments may relate to the incorporation of the stacked integrated component device into an ophthalmic lens. Without limiting the generality of embodiments that the inventive art herein may define, it may be illustrative to consider how the various elements that have been discussed could bear relevance to ophthalmic embodiments.

In an exemplary embodiment of an ophthalmic device containing stacked integrated devices with energization an ophthalmic lens may contain an electroactive lens component which responds to electrical signals to change the optical power of the lens, and when worn in an ophthalmic lens, then the optical power into the eyes of a user may be usefully controlled. Such an ophthalmic application may define a very limited space for the inclusion of devices and therefore, may be improved by the incorporation of thin stacked devices to provide function. Additionally, the shape of an ophthalmic lens is three dimensional object more similar to the surface of a sphere than to a flat plane; therefore, placing stacked devices whose shapes conform to circular shapes may allow for the optimization of utilized space. It may be important to understand, that in some embodiments a small stacked device which is planar and rectilinear may also comprise art consistent with an ophthalmic lens application. The stacked devices may in their variety of shapes be included into an insert which encapsulates the stacked devices and provides material aspects that are consistent with the materials that were described herein in the manufacture of ophthalmic lenses.

Continuing with the exemplary ophthalmic device embodiments, a stack of energized components may provide a number of functions which may be important in an ophthalmic lens application including the reception of external control signals and the activation of components based on the control signal. In addition, it may be useful in some applications to reenergize the battery device and the types of function towards charging that have been discussed may be useful. Alternatively, a wire battery as an external component may provide a battery that functions for a single discharge cycle.

In some embodiments, the energized components that receive control signals via wireless input may then enact a controller to set a particular voltage output. In such embodiments the output may then be routed via an external connection to the electroactive lens and change the optical power of the ophthalmic lens. In these manners, the utility of the various aspects of the inventive art described herein may be appreciated.

Conclusion

The present invention, as described above and as further defined by the claims below, provides devices and methods for stacked functional layer inserts and apparatus for implementing such methods, as well as ophthalmic lenses formed including the stacked layers.

The invention claimed is:

1. An ophthalmic device for inclusion in an ophthalmic lens, the ophthalmic device comprising:

three or more substrate layers comprising both passive and electronic components and mechanical components mounted thereto, wherein the substrate layers are each stacked upon one another such that they partially overlap by having at least one of the substrate layers out of alignment with another one of the substrate layers, and wherein the substrate layers stacked upon one another form a three-dimensional structure configured to match a profile of the ophthalmic lens, wherein the ophthalmic lens is selected from the group of a contact lens, an intraocular lens, an overlay lens, an ocular insert, or an optical insert;

one or more electrical conductors interconnecting the components on the three or more substrate layers; and one or more mechanical structures configured for providing structural support for the three or more substrate layers to form a stacked integrated component device;

wherein the stacked substrate layers are configured to be outside an optic zone of the ophthalmic lens.

2. The ophthalmic device according to claim 1, wherein the electronic components comprise at least one power source.

3. The ophthalmic device according to claim 2, wherein the at least one power source comprises a thin film solid state battery element.

4. The ophthalmic device according to claim 2, wherein the at least one power source comprises an alkaline battery element.

5. The ophthalmic device according to claim 2, wherein the at least one power source comprises a battery element formed about a conductive wire.

6. The ophthalmic device according to claim 2, wherein the at least one power source comprise at least a chemical energy storage device.

7. The ophthalmic device according to claim 2, wherein the at least one power source comprise at least a capacitive energy storage device.

8. The ophthalmic device according to claim 1, wherein the dimensional constraints of the one or more substrate layers are approximately rectilinear.

9. The ophthalmic device according to claim 1, wherein the dimensional constraints of the one or more substrate layers comprise regions that are approximately curvilinear.

10. The ophthalmic device according to claim 1, wherein the dimensional constraints of the one or more substrate layers comprise regions that are segments of a polygon.

11. The ophthalmic device according to claim 1, wherein the substrate layers are stacked upon one another such that each of the substrate layers are out of alignment with one another.

12. The ophthalmic device according to claim 1, wherein each of the substrate layers include at least one of either the passive component or the electronic component.

13. The ophthalmic device according to claim 1, wherein at least one of the substrate layers include both the passive component and the electronic component.

14. The ophthalmic device according to claim 1, wherein the one or more mechanical structures are further configured for providing structural support to each of the one or more substrate layers to form the stacked integrated component device.

15. The ophthalmic device according to claim 1, wherein the one or more mechanical structures are further configured for providing structural support to each substrate layer out of alignment with another one of the substrate layers.

16. The ophthalmic device according to claim 1, wherein the one or more mechanical structures include alignment features allowing the substrate layers to be aligned relative to each other.

17. An ophthalmic device for inclusion in an ophthalmic lens, the ophthalmic device comprising:

three or more substrate layers comprising both passive and electronic components and mechanical components mounted thereto, wherein the substrate layers are each stacked upon one another such that they partially overlap by having at least one of the substrate layers out of alignment with another one of the substrate layers, and wherein the substrate layers stacked upon one another form a three-dimensional structure configured to match a profile of the ophthalmic lens, wherein the ophthalmic lens is selected from the group of a contact lens, an intraocular lens, an overlay lens, an ocular insert, or an optical insert; and one or more electrical conductors interconnecting the components on the three or more substrate layers;

wherein the stacked substrate layers are configured to be outside an optic zone of the ophthalmic lens.

18. The ophthalmic device according to claim 17, further comprising:

one or more mechanical structures configured for providing structural support for the one or more substrate layers to form a stacked integrated component device.

* * * * *